United States Patent [19]

Kumar et al.

[11] Patent Number: 5,512,131

[45] Date of Patent: Apr. 30, 1996

[54] FORMATION OF MICROSTAMPED PATTERNS ON SURFACES AND DERIVATIVE ARTICLES

[75] Inventors: Amit Kumar, Sacramento, Calif.; George M. Whitesides, Newton, Mass.

[73] Assignee: President And Fellows Of Harvard College, Cambridge, Mass.

[21] Appl. No.: 131,841

[22] Filed: Oct. 4, 1993

[51] Int. Cl.$^6$ ........................................................ B44C 1/22
[52] U.S. Cl. ........................... 156/655.1; 156/628.1; 156/630.1; 156/631.1; 156/659.11; 216/13; 216/96; 437/235; 437/245; 427/74; 427/123
[58] Field of Search ............................... 156/628, 630, 156/631, 635, 645, 650, 655, 657, 659.1, 660, 661.1; 427/96, 256, 258, 259, 261, 264, 265, 270, 271, 272; 257/543

[56] References Cited

U.S. PATENT DOCUMENTS

| | | | |
|---|---|---|---|
| 2,905,539 | 9/1959 | Bowerman | 156/630 X |
| 4,587,213 | 5/1986 | Malecki | 435/39 |
| 4,690,715 | 9/1987 | Allara et al. | 148/6.15 |
| 5,032,216 | 7/1991 | Felten | 156/628 |
| 5,079,600 | 1/1992 | Schnur et al. | 427/54.1 X |
| 5,143,854 | 9/1992 | Pirrung et al. | 436/518 |
| 5,202,227 | 4/1993 | Matsuda et al. | 430/320 |
| 5,259,926 | 11/1993 | Kuwabara et al. | 156/658 X |

FOREIGN PATENT DOCUMENTS 58-150148  9/1983  Japan.

OTHER PUBLICATIONS

Laibinis et al., "Comparison of the Structures and Wetting Properties of Self–Assemblied Monolayers of n–Alkanethiols on the Coinage Metal Surfaces, Cu, Ag, Au$^{1"}$", Amer. Chem. Society, 1991, vol. 113., No. 19, pp. 7152–7167.
Kleinfeld et al., "Controlled Outgrowth of Dissociated Neurons on Patterned Substrates", Neuroscience, 1988, pp. 4098–4120.
Lopez et al., "Convenient Methods for Patterning the Adhesion of Adhesion of Mammalian Cells to Surfaces Using Self–Assemblied Monolayers of Alkanethiolates on Gold", Amer. Chemical Society, 1993, vol. 115, No. 13., pp. 5877–5878.
Dulcey et al., "Deep UV Photochemistry of Chemisorbed Monolayers: Patterned Coplanar Molecular Assemblies", Science, Apr. 26, 1991, vol. 252, pp. 551–554.
Westermark, B., "Growth Control in Miniclones of Human Glial Cells", Exp Cell Res, vol. 111, 1978, pp. 295–299.
Vargo, et al., "Monolayer Chem. Lithography and Characterization of Fluoropolymer Films", Langmuir, 1992, vol. 8, pp. 130–134.
Matsuda, et al., "Development of Micropatterning Technology for Cultured Cells", Trans. Am Soc Artif Intern Organs, 1990, vol. 36.
Ireland, et al., "Limitation of Substratum Size Alters Cyto–Skeletal Organization and Behaviour of Swiss 3T3 Fibroblasts", Cell Bio. Int'l Reports, vol. 13, No. 9, Sep. 1989, pp. 781–790.

(List continued on next page.)

Primary Examiner—William Powell
Attorney, Agent, or Firm—Wolf, Greenfield & Sacks

[57] ABSTRACT

A method of patterning a material surface is provided in which an elastomeric stamp having a stamping surface is coated with a self-assembled monolayer forming species having a functional group selected to bind to a particular material, and the stamping surface is placed against a surface of material and is removed to leave a self-assembled monolayer of the species according to the stamping surface pattern of the stamp. Additional stamping steps may be subsequently effected to produce any of a variety of SAM patterns on the surface. Additionally, portions of the material surface that are not coated with a stamped SAM pattern may be filled in with another SAM-forming species. Alternately, portions that are not covered by a SAM layer may be etched or plated. Additionally, an optical switch and other optical devices and elements are provided, comprising articles similar to the inventive stamp.

39 Claims, 10 Drawing Sheets

OTHER PUBLICATIONS

O'Neill, et al. "Narrow Linear Strips of Adhesive Substratum are Powerful Inducers of Both Growth and Total Focal Contact Area", Cell Science, 95, 1990, pp. 577–586.

Ponten et al., "Proliferation Control in Cloned Normal and Malignant Human Cells", Exper. Cell Research, 1980, pp. 367–375.

Lopez et al., "Imaging of Features on Surfaces by Condensation Figures", Science, Apr. 30, 1993, vol. 260, pp. 647–649.

Abbott et al., "Manipulation of the Wettability of Surfaces on the 0.1– to 1–Micrometer Scale Through Micromachining and Molecular Self–Assembly", Science, vol. 257, Sep. 1992, pp. 1380–1382.

Britland et al., "Micropatterned Substratum Adhesiveness: A Model for Morphogenetic Cues Controlling Cell Behavior", Exper. Cell Research, vol. 198, 1992, pp. 124–129.

Cromie, "Self–Assembling Molecules Manipulated by Chemists", Harvard's Gazette, Jul. 9, 1993.

Tiberio, et al., "Self–Assembled Monolayer Electron Beam Resist On GaAs", Anal. Phys. Lett., Feb. 1, 1993.

Kumar et al., "The Use of Self–Assembled Monolayers and a Selective Etch to Generate Patterned Gold Features", Amer. Chem. Society, Nov. 1992, vol. 114, pp. 9188–9189.

Tarlov et al., "UV Photopatterning of Alkanethiolate Monolayers Self–Assemblied on Gold and Silver", Am. Chem. Soc., 1993, 115.

Whitesides et al., "Wet Chemical Approaches to the Characterization of Organic Surfaces: Self–Assembled Monolayers, Wetting, and the Physical–Organic Chemistry of the Solid–Liquid Interface", Langmuir, 1990, vol. 6, pp. 87–96.

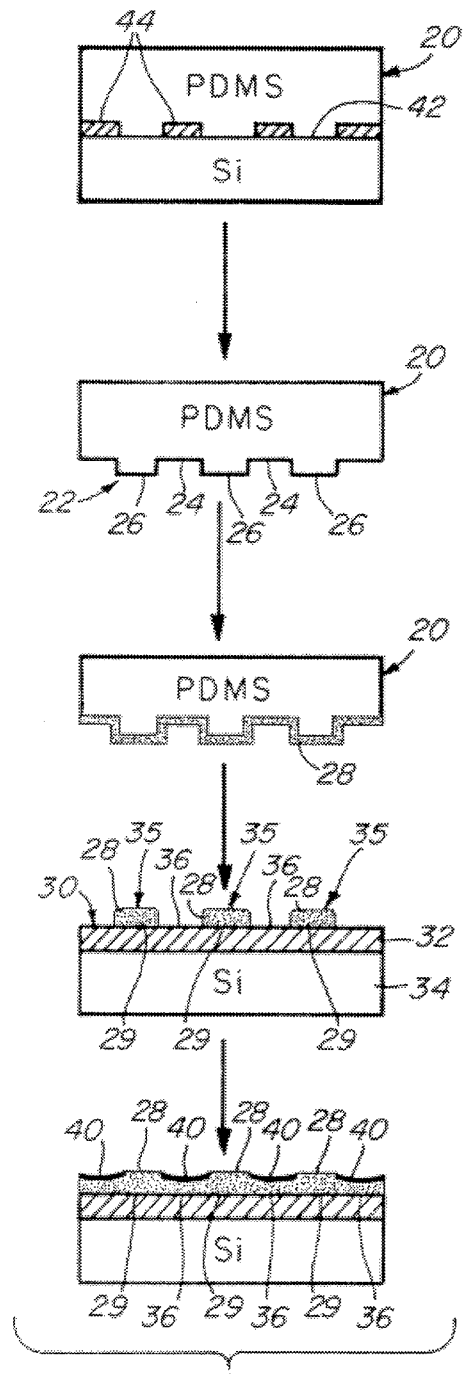
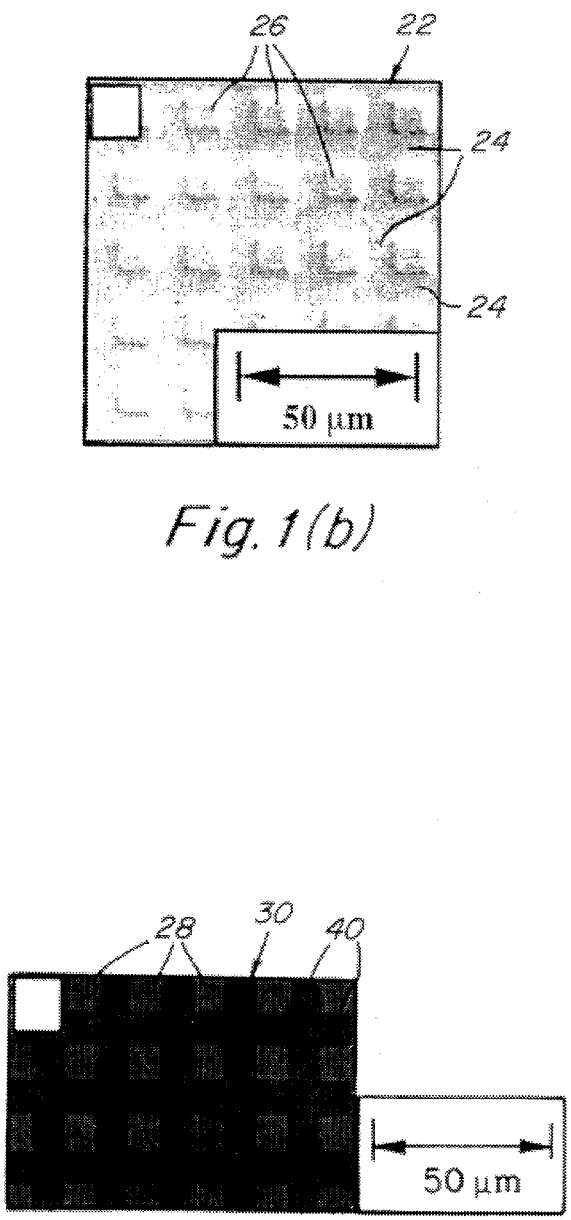
Fig. 1(a)
Fig. 1(b)
Fig. 1(c)

FORMATION OF MICROSTAMPED PATTERNS ON SURFACES AND DERIVATIVE ARTICLES

FIELD OF THE INVENTION

The present invention relates generally to derivatization and patterning of surfaces, and more particularly to the formation of self-assembled molecular monolayers on metal surfaces using a microstamp and novel articles produced thereby.

This invention was made with government support from NIH Grant No. GM30367 and ONR grant N00014-86-K-0756. The government has certain rights in the invention.

BACKGROUND OF THE INVENTION

In the field of microelectronic devices, sensors, and biochemical sensors, the development of devices that are small relative to the state of the art, conveniently and relatively inexpensively reproduced, and produced with a relatively low failure rate is important.

A well-known method of production of such devices is photolithography. According to this technique, a negative or positive resist (photoresist) is coated onto the exposed surface of a material. The resist then is then irradiated in a predetermined pattern, and irradiated (positive resist) or nonirradiated (negative resist) portions of the resist are washed from the surface to produce a predetermined pattern of resist on the surface. This is followed by one or more procedures. For example, the resist may serve as a mask in an etching process in which areas of the material not covered by resist are chemically removed, followed by removal of resist to expose a predetermined pattern of the conducting, insulating, or semiconducting material on the substrate. According to another example, the patterned surface is exposed to a plating medium or to metal deposition under vacuum, followed by removal of resist, resulting in a predetermined plated pattern on the surface of the material. In addition to photolithography, x-ray and electron-beam lithography have found analogous use.

While the above-described irradiative lithographic methods may be advantageous in many circumstances, all require relatively sophisticated and expensive apparatus to reproduce a particular pattern on a plurality of substrates, and are relatively time-consuming. Additionally, no method of patterning other than on a flat substrate is commonly available according to these methods. In the field of electronic circuitry, an attempt is often made to save space by stacking planar circuit boards or chips, the boards or chips interconnected with auxiliary contacts. Alternately, a board or chip may be bent or otherwise formed in a nonplanar manner so as to save space, auxiliary contacts connecting components on different sides of the bend. All too often these auxiliary contacts are the cause of circuitry failure, and the attempt to move from the two-dimensional domain to a three-dimensional domain fails. Irradiative lithography provides no remedy to this complication, nor does it provide a method of conveniently and inexpensively reproducing an existing microelectronic circuit pattern, or the surface morphological features of other objects of interest.

Additionally, the above-described irradiative techniques are generally not amenable to the patterning of biological species such as proteins, as they typically utilize resists and solvents that are toxic to many biological species.

A need exists in the art for a convenient, inexpensive, and reproducible method of plating or etching a surface according to a predetermined pattern. The method would ideally find use on planar or nonplanar surfaces, and would result in patterns having features in the micron and submicron domain. Additionally, The method would ideally provide for convenient reproduction of existing patterns. Additionally, a need exists for the fabrication of surfaces that can pattern portions amenable to attachment of biological species, such as antibodies, antigens, proteins, etc., on the micrometer scale.

The study of self-assembled monolayers (SAMs) is an area of significant scientific research. Such monolayers are typically formed of molecules each having a functional group that selectively attaches to a particular surface, the remainder of each molecule interacting with neighboring molecules in the monolayer to form a relatively ordered array. Such SAMs have been formed on a variety of substrates including metals, silicon dioxide, gallium arsenide, and others. SAMs have been applied to surfaces in predetermined patterns in a variety of ways including simple flooding of a surface and more sophisticated methods such as irradiative patterning.

Accordingly, a general purpose of the present invention is to provide a method of conveniently and reproducibly producing a variety of SAM patterns on planar as well as nonplanar surfaces, the patterns having resolution in the submicron domain, and being amenable to plating, etc. Another purpose of the invention is to facilitate the attachment of biomolecules on the submicron scale without loss of biological function. Another purpose of the invention is to provide a method of forming a template from an existing pattern having micron or submicron-domain features, the template conveniently reproducing the preexisting pattern.

SUMMARY OF THE INVENTION

The foregoing and other objects and advantages of the invention are achieved by providing methods of patterning a material surface, one involving the steps of providing a stamp having a surface including at least one indentation formed in the surface, the indentation being contiguous with a stamping surface defining a first stamping pattern, coating the stamping surface with a molecular species terminating at a first end in a functional group selected to bind to the material, positioning the stamping surface in a first orientation, and contacting a portion of the material surface with the stamping surface to hold the molecular species against the material surface portion to allow the functional group to bind to the surface. Finally, the stamping surface is removed to provide a self-assembled monolayer (SAM) of the molecular species on the material surface according to the first stamping pattern in the first orientation. According to the method, a second portion of the material surface contiguous with the portion onto which the SAM is provided remains free of the molecular species.

The method may involve positioning the stamping surface in a second orientation different from the first orientation, contacting another portion of the material surface with the stamping surface to hold the molecular species against the material surface to allow the functional group to bind thereto, and then removing the stamping surface to provide a second SAM of the molecular species according to the first pattern, but in the second orientation. The first pattern in the first orientation and the first pattern in the second orientation on the material surface may intersect or be free of intersection, to provide a continuous SAM or discontinuous SAMs, respectively.

Additionally, a variety of combinations of different stamping patterns, different pattern orientations, and different stamping steps may be combined with a variety of pattern shapes and a variety of molecular species to produce a very large variety of potential SAMs on a material surface. For example, the method may further comprise the steps of providing a second stamp having a surface including at least one indentation formed therein, the indentation being contiguous with a second stamping surface defining a second pattern different from the first pattern, coating the second stamping surface with a second molecular species different from the first species, the second species terminating at a first end in a functional group selected to bind the material, then contacting a portion of the material surface with the second stamping surface to hold the second molecular species against the material surface to allow the functional group to bind thereto, and removing the second stamping surface to provide a SAM of the second molecular species on the material surface according to the second pattern.

As noted above, a second portion of the material surface contiguous with the portion onto which the SAM is provided remains free of the molecular species. According to one method, at least one portion of the second portion may be contacted with a second molecular species terminating at a first end in a functional group selected to bind to the material. This forms a SAM of the second molecular species continuous with the SAM of the molecular species that had been provided on the surface of the material in an earlier step of the method. According to another method, at least a portion of the material surface remaining free of the molecular species may be contacted with a reactant selected to react chemically with the surface and selected to be chemically inert with respect to the molecular species such that the at least one second material surface portion is degraded. Then, the molecular species may be removed to uncover the material surface portion that had been covered by the SAM. Alternately still, the material surface portion remaining free of SAM according to the method may be plated with a plating reagent, and then the molecular species may be removed to uncover the material surface remaining free of plating, contiguous with the plated layer. The plated layer may be a conductor, nonconductor, semiconductor, conducting polymer, or the like.

The molecular species applied to the surface to form the SAM may terminate at a second end opposite the end that binds the material in a variety of functionalities, for example hydrophilic or hydrophobic functionalities may be selected. According to the above-described multi-step method, a SAM pattern comprising at least one discrete region exposing a particular functionality isolated by a continuous region exposing a different functionality may be provided on a material surface.

The above-described methods include a step of coating a stamping surface with a molecular species. The stamping surface may be created by a method involving the steps of fabricating a mold surface including at least one protrusion, contacting the mold surface with a hardenable fluid, hardening the fluid to form a stamp including a surface contacting the mold surface, and removing the stamp from the mold surface. Fabrication of the mold surface may be effected by patterning resist materials with electromagnetic radiation, by micromachining small dimensional features in a mold surface, by etching, plating, or the like.

The present invention also provides a microelectronic conductor fabricated by a process involving the steps of using a stamp formed from a mold, a micromachined mold according to one embodiment, to transfer a molecular species to an electrically conductive material surface to form a SAM in a first pattern, the SAM being contiguous with exposed portions of the electrically conductive material, contacting the exposed portions of the conductive material surface with a reactant selected to react chemically therewith and selected to be chemically inert with respect to the molecular species, such that the exposed portions of the conductive material are degraded, removing the degraded portions of the conductive material, and removing the molecular species to uncover portions of the conductive material.

Alternately, according to the invention, a microelectronic conductor may be fabricated by a process involving the steps of using a stamp formed from a mold, a micromachined mold according to one embodiment, to transfer a molecular species to a substrate surface to form a SAM according to a first pattern, the SAM being contiguous with exposed portions of the substrate, plating the exposed substrate portions with a plating reagent, and removing the molecular species to uncover portions of the substrate according to the first pattern bordered by plated portions of the substrate.

Also provided in accordance with the invention is a stamp for transferring a molecular species to a surface. The stamp includes a surface having at least one indentation formed therein and a stamping surface adjacent the at least one indentation for carrying a SAM-forming molecular species and transferring the molecular species to a substrate. The stamping surface is formed of a swellable material selected to absorb the molecular species. The stamping surface, according to one embodiment, comprises at least one resolved feature providing stamping resolution of less than about 100 microns.

Also provided according to the present invention is a surface derivatized so as to expose at least two regions having different chemical functionalities, comprising a base material, a SAM on a surface of the base material, the SAM comprising at least one isolated region of a first molecular species, the first species terminating at a first end in a functional group bound to the base material surface and terminating at a second, exposed end with a first functionality. The surface has a continuous region of a second molecular species surrounding the first region, the second species terminating at a first end in a functional group bound to the base material surface and terminating at a second, exposed end with a second functionality different from the first functionality. According to one embodiment, the first isolated region has a lateral dimension of less than about 10 microns.

The present invention also provides a method for derivatizing a surface, involving the steps of applying instantaneously to a surface a plurality of discrete isolated regions of a first, SAM-forming molecular species while leaving intervening regions free of the species.

Also provided in accordance with the present invention is a method for transferring a stamp-adherent species to a surface in a pattern having at least one lateral dimension of less than 100 microns.

Also provided in accordance with the invention is an optical switch including an elastic switching member having a surface including at least one indentation formed therein. The at least one indentation is formed such that electromagnetic radiation passing through the switching member when the member is in a first, unstressed conformation forms a first detectable image and formed such that electromagnetic radiation passing through the switching member when the member is in a second, stressed conformation forms a second detectable image differentiable from the first image. The switch also includes a modulator contacting the switching member and movable between a first position placing the member in a first, unstressed conformation and a second position placing the member in a second, stressed conformation. The optical switch may serve as a pressure sensor.

Other advantages, novel features and objects of the invention will become apparent from the following detailed description of the invention when considered in conjunction with the accompanying drawings.

BRIEF DESCRIPTION OF THE DRAWINGS

In the drawings:

FIGS. 1a–1c are schematic illustrations of the stamping process of the present invention, including photocopies of photomicrographs of an exemplary stamping surface and a scanning electron micrograph (SEM) image of a SAM pattern formed according to the inventive process;

DETAILED DESCRIPTION OF THE PREFERRED EMBODIMENT

Figure 2A:
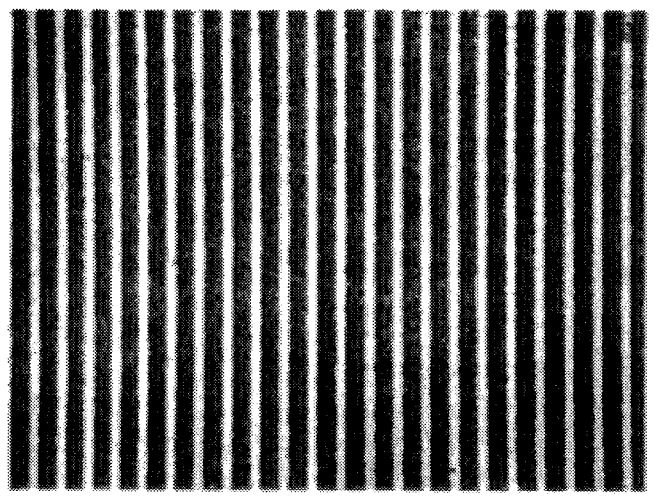
FIGS. 2a–2c provide photocopies of SEM images of material surfaces formed using a stamp having a particular pattern oriented in a variety of ways.

Referring now to FIG. 1, and in particular to FIG. 1(a), a schematic illustration of a stamping method of the present invention is presented. According to the method, a stamp 20 is provided having a surface 22 including indentations 24 formed therein and defining an indentation pattern, the indentations contiguous with a stamping surface 26 defining a stamping pattern. The stamping surface is coated with a molecular species 28 terminating in a functional group selected to bind to a particular material. The stamp is positioned in a first orientation and is brought into contact with first portions 29 of a surface 30 of a particular material 32 which may be provided on a substrate 34. Stamping surface 26 is held against portions of surface 30 of material 32 to hold molecular species 28 against the material surface to allow the functional group to bind thereto (holding step not shown). Then, the stamping surface is removed to provide SAM 35 of the molecular species 28 on surface 30 according to the stamping pattern in the first orientation. Second portions 36 of surface 30, contiguous with first portions 29, remain free of molecular species 28.

Subsequently, a variety of procedures may be followed according to the invention. According to one, second material surface portions 36 are contacted with a second molecular species 40 terminating at a first end in a functional group selected to bind to material surface 30, to form a SAM continuous with the SAM of molecular species 28 on surface 30. Molecular species 28 and second molecular species 40 may each terminate at second, exposed ends with particular desirable functionalities which may be the same or different. According to one embodiment, the exposed functionality of molecular species 28 is hydrophilic while the exposed functionality of second molecular species 40 is hydrophobic.

FIG. 1(b) is a microscopic view of surface 22 of a stamp 20 formed according to one embodiment of the present invention. According to this embodiment, surface 22 includes a plurality of indentations 24 which form a continuous, grid-like indentation pattern, contiguous with stamping surface 26 defining a stamping pattern of squares. When stamping surface 26 is coated with the molecular species as described above, and the coated stamping surface is positioned so as to contact a portion 29 of material surface 30, an ordered SAM pattern of the molecular species, identical to the pattern of stamping surface 26, is transferred to surface 30. Illustrated in FIG. 1(c) is the pattern of molecular species 28 on surface 30, according to the pattern. The illustration is a photocopy of a SEM of a representative embodiment. All further references to SEM or microscopic images, micrographs, photographs, illustrations, diffraction patterns and the like shall mean photocopies of such visual representations. When second portions 36 of surface 30 are then contacted with second molecular species 40, a SAM of the second molecular species 40 continuous with the SAM of molecular species 28 is formed on surface 30. This can be clearly seen in the SEM of FIG. 1(c) where the continuous SAM of molecular species 28 and 40 is illustrated. When molecular species 28 and second molecular species 40 each terminate in different exposed functionalities (exposed being defined to mean functionality in the SAM facing away from surface 30), this embodiment of the invention permits a surface derivatized so as to provide at least two regions having different exposed chemical functionalities, including a base material 32, and a SAM on a surface 30 of the base material, the monolayer comprising at least one isolated region of a first molecular species 28, and a continuous region of a second molecular species 40 surrounding the first region. According to one embodiment of the invention, the first isolated region has a lateral dimension of less than about 10 microns. According to other embodiments, a first isolated region may have a lateral dimension of less than about 5, 2, 1, 0.5, or 0.25 microns. According to a particularly preferred embodiment, the first isolated region has a lateral dimension of about 0.2 microns. As used herein, the term "lateral dimension" is meant to define the distance across any portion of a SAM surface that differs in any way from its surrounding environment. Such differences may be chemical, physical, or biological. When viewing a surface directly, a lateral dimension would be a dimension of a SAM perpendicular to the line of sight.

According to another embodiment of the invention, the area of the exposed portion of a SAM may be important. For example, and with reference to the derivatized surface 30 illustrated in FIG. 1(c), a first isolated region comprising a region of the SAM formed of species 28 has an exposed area of less than about 10,000 square microns, although areas of much more than this are within the scope of the present invention. Additionally, such an isolated region may have an exposed area of less than 1,000, 100, 40, 25, 2, 1 or 0.06 square microns. According to a particularly preferred embodiment, a derivatized surface including an isolated SAM region having an exposed area of about 0.04 square microns is provided.

Stamp 20 may be formed in a variety of ways. With reference to FIG. 1(a), an embodiment of such formation is illustrated in which stamp 20 is formed by contacting a mold surface 42 with a hardenable material, typically a fluid, which serves as a precursor of stamp 20. The fluid is hardened, for example by ionic, nonionic, or free-radical polymerization to form stamp 20 having a surface contacting the mold surface. Mold surface 42 is advantageously selected to include at least one protrusion 44, and when the stamp 20 is removed from mold surface 42, a stamp having a stamping surface 26 including an indentation 24 corresponding to mold surface protrusion 44 results.

The particular material chosen for formation of stamp 20 should satisfy certain physical characteristics. Stamp 20 is advantageously chosen to be elastic, such that stamping surface 26 may very closely conform to minute irregularities in surface 30 of material 32 so as to completely transfer molecular species 28 thereto, and so as to be amenable to transferring SAMs of molecular materials to nonplanar surfaces. However, stamping surface 26 should not be so elastic that when it is pressed lightly against a surface, stamping surface features deform to the extent that blurring of molecular species 28 on material surface 30 results.

The ability to transfer SAMs to nonplanar surfaces is particularly advantageous in the preparation of microelectronic devices on curved surfaces, for example microconnections between various circuit regions, the connections conforming to a bend to conserve space in an overall circuit-containing region. Stamp 20 should also be formed such that stamping surface 26 comprises a absorbent material selected to absorb SAM-forming molecular species 28 to be transferred to a surface 30 to form a SAM thereon. Stamping surface 26 preferably swells to absorb molecular species 28, and/or to absorb molecular species 28 dissolved or suspended in a carrier such as an organic solvent. Such swelling and absorbing characteristics serve the important function of providing good definition of an isolated SAM on a surface. For example, if a dimensional feature of stamping surface 26 includes a substantially square-shaped feature as illustrated in FIG. 1(b), surface 26 should transfer molecular species 28 to surface 30 of material 32 so as to form SAMs mirroring the substantially square features of stamping surface 26, without blurring. Such blurring results from selection of a stamp which does not absorb molecular species 28. When such a stamp is employed, molecular species 28 resides as a fluid on stamping surface 26, rather than partially or fully within surface 26, and when stamping surface 26 contacts material surface 30, molecular species 28 is dispersed from under stamping surface 26. According to the stamp of the present invention, however, molecular species 30 is absorbed into stamping surface 26, and when stamping surface 26 contacts material surface 30, molecular species 28 is not dispersed, but binds to surface 30, and removal of stamping surface 28 from surface 30 results in well-defined SAM features.

Additionally, stamp 20 should be fabricated such that stamping surface 26 is free of any leachable materials such as plasticizers that would interfere with or contaminate molecular species 28. For example, if additives are included in the material used to fabricate stamp 20, such additives should be bound to the internal structure of stamp 20. For example, if stamp 20 is fabricated from a polymeric material, any additives should be bound to the polymer backbone thereof.

Material selected for use in fabrication of stamp 20 is advantageously selected so as not to undergo substantial shape changes when stamp 20 is formed. For example, when a hardenable fluid is brought into contact with mold surface 44 and is hardened, little or no shape change should take place upon such hardening. Thus, any shape changes of features of stamping surface 26 should be within tolerable limits of precision for formation of SAM features of molecular species 28 transferred to surface 30 by stamping surface 26. If any shape changes do occur upon hardening of material selected for fabrication of stamp 20, it may be desirable that such changes involve miniaturization of stamping surface 26 features.

According to a preferred embodiment, stamp 20 is formed from a polymeric material. Polymeric materials suitable for use in fabrication of stamp 20 may have linear or branched backbones, and may be crosslinked or noncrosslinked, depending upon the particular polymer and the degree of formability desired of the stamp. A variety of elastomeric polymeric materials are suitable for such fabrication, especially polymers of the general classes of silicone polymers, epoxy polymers, and acrylate polymers. Epoxy polymers are characterized by the presence of a three-member cyclic ether group commonly referred to as an epoxy group, 1, 2-epoxide, or oxirane. For example, diglycidyl ethers of bisphenol A may be used, in addition to compounds based on aromatic amine, triazine, and cycloaliphatic backbones. Another example includes the well-known Novolac polymers. Materials which may not be suitable for fabrication of stamping surface 26 according to preferred embodiments include polyethylene and polystyrene, which are generally too brittle, (not elastic enough), and polybutadiene, which is generally too elastic.

Examples of silicone elastomers suitable for use as stamp 20 include those formed from precursors including the chlorosilanes such as methylchlorosilanes, ethylchlorosilanes, and phenylchlorosilanes, and the like. A particularly preferred silicone elastomer is polydimethylsiloxane. Exemplary polydimethylsiloxane polymers include those sold under the trademark Sylgard by the Dow Chemical Company, Midland, Mich., and particularly Sylgard 182, Sylgard 184, and Sylgard 186.

Stamp 20 includes stamping surface 26 having a variety of features defined therein by indentations 24. According to the invention, stamping surface 26 may include features having a variety of lateral dimensions, including very large lateral dimensions for transferring a large SAM of molecular species 28 to material surface 30. According to some embodiments of the invention, however, it is highly advantageous to fabricate stamping surface 26 so as to have at least one feature with a lateral dimension of less than about 100 microns. According to other embodiments, stamping surface 26 may include at least one feature with a lateral dimension of less than about 50 microns, less than about 10 microns, less than about 5 microns, or less than about 1 micron. According to a particularly preferred embodiment, stamping surface 26 includes at least one feature with a lateral dimension of less than 0.25 microns.

The features included in stamping surface 26 are advantageously created in a way that the aspect ratio of any individual feature is greater than 0.2, preferably from about 0.5 to about 2.0, although when a large stamping surface is chosen to form a large, continuous SAM area on a surface, the aspect ratio may be much larger. The aspect ratio is defined as the ratio of minimum lateral dimension of any stamping surface feature to indentation depth. Referring to FIG. 1(a), the aspect ratio of stamping surface features is x/y. In addition to the aspect ratio, the width of any indentation (dimension z in FIG. 1(a)) should not be large enough such that "bowing" of the stamping surface occurs and any portion of the indentation of the stamping surface contacts the material surface to be patterned. Such bowing is generally avoided if the ratio of indentation width (dimension c) to indentation depth (dimension x) is less than about 10.

In addition to the above-described methods for forming stamp 20, a photolytic method is included in the present invention. For example, a mask may be positioned between a surface 22 of stamp 20 and a source of irradiation, and the surface 22 irradiated through the mask for a predetermined period of time. Portions of surface 22 may be degraded by such irradiation, forming indentations 24 in surface 22 upon removal of such degraded portions, and defining stamping surface 26. According to this method, a variety of patterns may be very conveniently formed in a stamp according to a variety of available masks. In addition, the photolytic method may be used in combination with the above-described methods involving hardening a hardenable fluid on a mold surface. For example, a hardenable fluid may be contacted with mold surface 42 and allowed to harden to form stamp 20 having a first predetermined stamping surface, the first predetermined stamping surface irradiated through a mask to create additional features in the stamping surface. According to this method, photoresist may be used as the stamp material itself. Particular types of polymers which may be patterned using the above-described photolytic method, preferred wavelengths for photopatterning, and lengths of time of photolysis are known in the art.

In its broadest sense, mold surface 42 may comprise any surface having morphological features that may desirably serve as a template for the formation of a stamp, hence the patterning of a molecular species on a surface. For example, a microeletronic device such as a chip may serve as a template, as may any other corrugated or indented surface. Mold surface 42 may be formed according to a variety of ways. According to one, the mold surface is micromachined from a material such as metal. According to another, mold surface 42 is formed lithographically by providing a substrate, depositing a film of material onto the substrate, coating an exposed surface of the material with resist, irradiating the resist according to a predetermined pattern, removing irradiated portions of the resist from the material surface, contacting the material surface with a reactant selected to react chemically therewith and selected to be chemically inert with respect to the resist such that portions of the material according to the predetermined pattern are degraded, removing the degraded portions, and removing the resist to uncover portions of the material formed according to the predetermined pattern to form the mold surface. Negative or positive resist may be used, and the procedure adjusted accordingly. According to another method of forming mold surface 42, a substrate may be provided, and coated with resist. Then portions of the resist may be irradiated according to a particular predetermined pattern. Irradiated portions of the resist may then be removed from the substrate to expose portions of the substrate surface according to the predetermined pattern, and the substrate may be contacted with a plating reagent such that exposed portions according to the predetermined pattern are plated. Then, the resist may be removed to uncover portions of the exposed substrate according to the predetermined pattern bordered by plated portions of the substrate to form the mold surface.

Material 32 and molecular species 28 are selected such that molecular species 28 terminates at a first end in a functional group that binds to a surface 30 of material 32. As used herein, the terminology "end" of a molecular species, and "terminates" is meant to include both the physical terminus of a molecule as well as any portion of a molecule available for forming a bond with surface 30 in a way that the molecular species can form a SAM, or any portion of a molecule that remains exposed when the molecule is involved in SAM formation. Molecular species 28 may comprise a molecule having first and second terminal ends, separated by a spacer portion, the first terminal end comprising a functional group selected to bond to surface 30, and the second terminal group optionally including a functional group selected to provide a SAM on material surface 30 having a desirable exposed functionality. The spacer portion of the molecule may be selected to provide a particular thickness of the resultant SAM, as well as to facilitate SAM formation. Although SAMs of the present invention may vary in thickness, as described below, SAMs having a thickness of less than about 50 Angstroms are generally preferred, more preferably those having a thickness of less than about 30 Angstroms and more preferably those having a thickness of less than about 15 Angstroms. These dimensions are generally dictated by the selection of molecular species 28 and in particular the spacer portion thereof.

A wide variety of materials 32 and SAM-forming molecular species 28 are suitable for use in the present invention. A nonlimiting exemplary list of combinations of material 32 and functional groups included in molecular species 28, such functional groups selected so as to bind to material 30, follows. It is to be understood, however, that any electrically conductive, electrically nonconductive, or electrically semiconductive material forming a solid phase at room temperature may be used as material 32 in the present invention, as long as a functional group attachable to or contained within a molecular species, the functional group binding to the material, is available. Although the following list categorizes certain preferred materials with certain preferred functional groups which firmly bind thereto, many of the following functional groups would be suitable for use with exemplary materials with which they are not categorized, and any and all such combinations are within the scope of the present invention. Preferred materials for use as material 32 include metals such as gold, silver, copper, cadmium, zinc, palladium, platinum, mercury, lead, iron, chromium, manganese, tungsten, and any alloys of the above with sulfer-containing functional groups such as thiols, sulfides, disulfides, and the like; doped or undoped silicon with silanes and chlorosilanes; metal oxides such as silica, alumina, quartz, glass, and the like with carboxylic acids; platinum and palladium with nitriles and isonitriles; and copper with hydroxamic acids. Additional suitable functional groups include acid chlorides, anhydrides, sulfonyl groups, phosphoryl groups, hydroxyl groups and amino acid groups. Additional surface materials include germanium, gallium, arsenic, and gallium arsenide. Additionally, epoxy compounds, polysulfone compounds, plastics and other polymers may find use as material 30 in the present invention. Additional materials and functional groups suitable for use in the present invention can be found in U.S. Pat. No. 5,079,600, issued Jan. 7, 1992, and incorporated herein by reference.

According to a particularly preferred embodiment, a combination of gold as a material 32 and a molecular species 28 having at least one sulfer-containing functional group such as a thiols, sulfide, or disulfide is selected. The interaction between gold and such sulfer-containing functional groups is a well-studied science, and a nonlimiting representative exemplary list of such sulfer-containing functionalities may be found in an article entitled "Wet Chemical Approaches to the Characterization of Organic Surfaces: Self-Assembled Monolayers, Wetting and the Physical-Organic Chemistry of the Solid-Liquid Interface", by G. W. Whitesides and Paul E. Laibinis, Langmuir, 6, 87 (1990), incorporated herein by reference.

Molecular species 28 may terminate in a second end opposite the end bearing the functional group selected to bind to material 32, in any of a variety of functionalities. That is, molecular species 28 may include a functionality that, when molecular species 28 forms a SAM on surface 30 of material 32, is exposed. Thus, according to the some embodiments the functional group would literally define a terminus of the molecular species, while according to other embodiments the functional group would not literally define a terminus of the molecular species, but would be exposed.

Such functionality may be selected to create a SAM that is hydrophobic, hydrophilic, amphipathic, that selectively binds various biological or other chemical species such as proteins, antibodies, antigens, sugars and other carbohydrates, and the like. For example, ionic, nonionic, polar, nonpolar, halogenated, alkyl, aryl or other functionalities may exist at the exposed portion of molecular species 28. A nonlimiting, exemplary list of such functional groups includes those described above with respect to functional group attachment to surface 30 of material 32 in addition to:

—OH, —CONH—, —CONHCO—, —$NH_2$, —NH—, —COOH, —COOR, —CSNH—, —$NO_2^-$, —$SO_2^-$, —RCOR—, —RCSR—, —RSR, —ROR—, —$PO_4^{-3}$, —$OSO_3^{-2}$, —$SO_3^-$, —$NH_xR_{4-x}^+$, —$COO^-$, —$SOO^-$, —RSOR—, —$CONR_2$, —$(OCH_2CH_2)_nOH$ (where n=1–20, preferably 1–8), —$CH_3$, —$PO_3H^-$, —2-imidazole, —$N(CH_3)_2$, —$NR_2$, —$PO_3H_2$, —CN, —$(CF_2)_nCF_3$ (where n=1–20, preferably 1–8), olefins, and the like. In the above list, R is hydrogen or an organic group such as a hydrocarbon or fluorinated hydrocarbon. As used herein, the term "hydrocarbon" includes alkyl, alkenyl, alkynyl, cycloalkyl, aryl, alkaryl, aralkyl, and the like. The hydrocarbon group may, for example, comprise methyl, propenyl, ethynyl, cyclohexyl, phenyl, tolyl, and benzyl groups. The term "fluorinated hydrocarbon" is meant to refer to fluorinated derivatives of the above-described hydrocarbon groups. Additionally, R may be a biologically active species such as an antigen, antibody, hapten, etc. Such embodiments are described below, and attachment of such biologically active groups to molecular species 28 is known to those of ordinary skill in the art.

As noted above, molecular species 28 may form a SAM having exposed functionality including hydrophobic, hydrophilic, and amphipathic functionality, that selectively binds various biological or other chemical species such as proteins, antibodies, antigens, sugars and other carbohydrates, and the like. The exposed functionality may comprise a member of any specific or non-specific binding pair, such as either member of the following non-limiting list: antibody/antigen, antibody/hapten, enzyme/substrate, enzyme/inhibitor, enzyme/cofactor, binding protein/substrate, carrier protein/substrate, lectin/carbohydrate, receptor/hormone, receptor/effector, complementary strands of nucleic acid, repressor/inducer, or the like.

The central portion of molecules comprising molecular species 28 generally includes a spacer functionality connecting the functional group selected to bind to surface 30 and the exposed functionality. Alternately, the spacer may essentially comprise the exposed functionality, if no particular functional group is selected other than the spacer. Any spacer that does not disrupt SAM packing and that allows the SAM layer to be somewhat impermeable to various reagents such as etching and plating reagents, as described below, in addition to organic or aqueous environments, is suitable. The spacer may be polar, nonpolar, positively charged, negatively charged, or uncharged. For example, a saturated or unsaturated, linear or branched alkyl, aryl, or other hydrocarbon spacer may be used, as well as corresponding halogenated hydrocarbons, especially fluorinated hydrocarbons.

Thus, molecular species 28 generally comprises a species having the gereralized structure R'—A—R", where R' is selected to bind to surface 30 of material 32, A is a spacer, and R" is a group that is exposed when species 28 forms a SAM. Also, molecular species 28 may comprises a species having the gereralized structure R'"—A'—R'—A—R", where A' is a second spacer or the same as A, or R'"—A'—R'—A—R", where R'" is the same or different exposed funtionality as R". Additionally, species such as R'—A—R"—B and B—R'"—A'—R'—A—R"—B" may be chosen, where B and B' are similar to A, do not prevent exposure of R'" and R" to the surrounding environment, and may be the same or different. It is to be understood that, in the above generalized formulas, A and R" or R'" may not be distinguishable, but may be continuous. For example, when A comprises an alkyl chain, and R" or R'" comprises an alkyl functionality, A and R" or R'" together may simply define an alkyl chain.

A particularly preferred class of molecules suitable for use as molecular species 28, when material 32 comprises gold, silver, and copper, are the omega-functionalized thiols, that is, those having the generalized structure R'—A—R", where R' =—SH, A=—$(CH_2)_n$— where n=1–30, preferably 1–20, and R"=—$CH_3$; —OH; —$O(CH_2)_nH$, where n=1–15, preferably 1–7; —$CONH(CH_2)_nH$, where n=1–15, preferably 1–7; —$NHCO(CH_2)_nH$, where n=1–15, preferably 1–7; —$(OCH_2CH_2)_nH$, where n=1–15, preferably 1–7; and —COOH.

A variety of lengths of molecular species 28 may be employed in the present invention. If two or more different molecular species are used in one coating step, for example if two or more different species are used as molecular species 28 in FIG. 1(a), it is often advantageous that these species have similar lengths. However, when a two or more step process is used in which a first SAM is provided on a surface and at least a second SAM is provided on the surface, the various SAMs being continuous or noncontinuous, it may be advantageous in some circumstances to select molecular species for formation of the various SAMs that have different lengths. For example, and with reference to FIG. 1(c), if molecular species 28 has a first molecular length and molecular species 40 has a second molecular length greater than that of molecular species 28, a continuous SAM having a plurality of "wells" results. These wells are the result of molecular species 28 being surrounded by molecular species 40 having a longer chain length. Such wells may be advantageously fabricated according to certain embodiments, for example, when it is desirable to add greater lateral stability to particular species desirably captured in wells above molecular species 28. Such wells may also form the basis for reaction vessels or "microreactors" such as, for example for the fabrication of nanoparticle devices, semiconductor crystallites, or the like. Additionally, such microreactors may be formed by patterning a surface in which regions of exposed surface material are surrounded by a SAM pattern. Thus, small microwells of, for example, a substrate surface may be exposed, the wells surrounded by SAM. Such may be advantageous when the material surface is amenable to certain reactions. For example, many biological systems flourish on surfaces such as gold.

Even without the formation of such physical wells, as described above, the present invention may provide one or more droplet microreactors of determinable volume on a surface. For example, and with reference to FIG. 1(c), if exposed portions of molecular species 28 are hydrophilic and exposed portions of molecular species 40 are hydrophobic, a plurality of droplets of aqueous fluid may be placed on the exposed portions of molecular species 28. With knowledge of the surface area of exposed regions defined by species 28, and the surface tension of the aqueous fluid and hydrophobicity and hydrophilicity of the exposed regions (measured, for example, by contact angle), the volume of the droplets may be determined. Thus, if the volume of the droplet microreactors is known and/or can be controlled, and the concentration of a particular reacting species in an aqueous fluid may be controlled, microreactions tailored in terms of concentration and volume conditions may be effected. If exposed portions of molecular species 28 are hydrophobic and exposed portions of molecular species 40 are hydrophilic, microreactions in organic liquids may be carried out in a controlled manner analogous to the above-described reactions in aqueous environments. According to the above-described droplet microreactors, the microreactors generally are best kept in an environment in which they do not evaporate if constant volume is to be achieved. For example, an aqueous microreactor system would be best kept in a humid environment. Alternately, controlled evaporation from the microreactor may be an object to control precipitation or crystallization conditions, or the like.

Such microreactors may be used to crystallize patterns of various materials exhibiting unique optical and/or other properties such as frequency doubling properties. A coherent laser beam diffracting off of these patterned crystallites would produce first, second, and higher order harmonics as diffraction patterns. For example, $LiNbO_3$ or $KNbO_3$ would be suitable for this purpose.

Additionally, SAMs formed on surface 30 may be modified after such formation for a variety of purposes. For example, a molecular species 28 may be deposited on surface 30 in a SAM, the molecular species having an exposed functionality including a protecting group which may be removed to effect further modification of the SAM. For example, a photoremovable protecting group may be used, the group being advantageously selected such that it may be removed without disturbance of the SAM of which it is a part. For example, a protective group may be selected from a wide variety of positive light-reactive groups preferably including nitroaromatic compounds such as o-nitrobenzyl derivatives or benzylsulfonyl. Photoremovable protective groups are described in, for example, U.S. Pat. No. 5,143,854, issued Sep. 1, 1992, and incorporated herein by reference, as well as an article by Patchornik, JACS, 92, 6333 (1970) and Amit et al, JOC, 39, 192, (1974), both of which are incorporated herein by reference.

Alternately, a reactive group may be provided on an exposed portion of molecular species 28 that may be activated or deactivated by electron beam lithography, x-ray lithography, or any other radiation. Such protections and deprotections may aid in chemical or physical modification of an existing surface-bound SAM, for example in lengthening existing molecular species forming the SAM. Such modification is described in U.S. Pat. No. 5,143,857, referenced above.

Additionally, one method of providing a surface having a pattern of contiguous and distinct SAM regions, in accordance with the present invention, may result from providing a first pattern of a first SAM having a first exposed functionality on the surface. Then, the functionality may be chemically or photochemically activated to be converted to a second functionality. Then, remaining exposed regions of the surface may be filled in with the original SAM material.

In addition, a molecular species may be prepared with an optically recordable functionality such that when a SAM is formed, the optical recording functionality is exposed. This may be particularly advantageous when a plurality of small, isolated SAM regions are bounded by a continuous and different SAM region, such as is illustrated in FIG. 1(c). As used herein, the term "optically recordable" is meant to define any species which may be converted from a first detectable state to a second detectable state using electromagnetic radiation, the species remaining in the second detectable state under normal recording circumstances, and erased to the first detectable state by means of electromagnetic radiation, thermal treatment, or chemical treatment. For example, azo or diazo compounds may comprise an exposed functionality on a region of a SAM of the present invention to produce an optical recording medium.

Material 32 may comprise its own substrate, or may be a thin film deposited upon a substrate 34. Where a separate substrate 34 is employed, it may comprise any biological, nonbiological, organic, or inorganic material, or a combination of any of these existing as particles, strands, precipitates, gels, sheets, tubing, spheres, containers, capillaries, pads, slices, films, plates, slides, etc. Generally, the substrate 34 of the present invention is substantially planar, although it need not be according to certain embodiments. Substrate 34 may be formed of a conductive, nonconductive, semiconducting material, or the like, and may comprise glass, silica, alumina, plastic or other organic polymers for example acrylonitrile-butadine-styrene copolymers, polysulfone, polystyrene, metals, or any of the above materials described with respect to material 32 of the present invention. Substrate 32 may also comprise a bioerodable material such as, for example, poly(glycolic acid), polyanhydrides, polyorthoesters, polylactic acid, or combinations thereof. Substrate 32 may include a bonding layer, for example a thin titanium film, to promote adhesion between material 32 and substrate 34.

Material 32 is generally of a thickness on the order of 2000 Angstroms, but may be substantially thicker or may be substantially thinner. For example, when substrate 34 as a base material is employed, material 30 may have a thickness of less than about 100 nanometers, less than about 10 nanometers, or even less than about 6 nanometers. When a very thin film of material 32 is employed, and a transparent substrate 34 supports material 32, a transparent base support for a SAM results, and this may be advantageous in photochemical activation of or spectrochemical detection or analysis of any species interacting with an SAM on surface 30 of material 32.

Molecular species 28 may be coated onto stamping surface 26 by any convenient method, for example, molecular species 28 may be absorbed into a piece of paper, and stamping surface 26 may then be pressed against the piece of paper. Alternately, a cotton swab or the like may be used to transfer molecular species 28 to stamping surface 26. Molecular species 28 may be very rapidly transferred to stamping surface 26. For example, contacting stamping surface 26 with molecular species 28 for a period of time of approximately 2 seconds is adequate to effect the sufficient transfer, or contact may be maintained for substantially longer periods of time.

Generally, molecular species 28 is dissolved in a solvent for transfer to stamping surface 26. The concentration of molecular species 28 in such a solvent for transfer should be selected to be low enough that species 28 is well-absorbed into surface 26, and high enough that a well-defined SAM may be transferred to a material surface without blurring. Typically, species 28 will be transferred to stamping surfaced 26 in a solvent at a concentration of less than 100 mM, preferably from about 0.5 to about 20.0 mM, and more preferably from about 1.0 to about 10.0 mM. Any organic solvent within which molecular species 28 dissolves, and which may be absorbed by stamping surface 26, is suitable. In such selection, if stamping surface 26 is relatively polar, a relatively polar and/or protic solvent may be advantageously chosen. If stamping surface 26 is relatively nonpolar, a relatively nonpolar solvent may be advantageously chosen. For example, toluene, ethanol, THF, acetone, isooctane, diethyl ether, and the like may be employed. When a siloxane polymer is selected for fabrication of stamp 20, and in particular stamping surface 26, ethanol, acetone, and diethyl ether are preferred solvents. The use of such an organic solvent generally aids in the absorption of molecular species 28 by stamping surface 26. When molecular species 28 is transferred to stamping surface 26, either near or in a solvent, the stamping surface should be dried before the stamping process is carried out. If stamping surface 26 is not dry when the SAM is stamped onto the material surface, that is, if gross liquid remains on the stamping surface, blurring of the SAM will result from dispersion of the liquid from under the stamping surface. Stamping surface 26 may be air dried, blow dried, or dried in any other convenient manner. The drying manner should simply be selected so as not to degrade the SAM-forming molecular species 28.

The present invention also provides for a variety of biosensors. Such biosensors may be fabricated by providing a SAM having exposed functionalities that are amenable for detecting a particular species in a medium to which the SAM is exposed. For example, a SAM may be provided with exposed functionality including an antigen, antibody, or any of a variety of specific or non-specific binding pairs, as noted above. Accordingly, the SAM may serve a function analogous to that of a microparticle or titer plate which has been prepared for a test assay such as an immunoassay. With reference to FIG. 1c, if isolated regions 28 are formed of a SAM bearing such functionality, isolated by SAM 40, many test assays may be run in a very, very small area, if individual regions 28 are individually functionalized with a different analyzing species. As described herein, material 32 may be provided in a very thin film, and may be provided on a transparent substrate such as a glass slide. When this embodiment is fabricated, the resultant slide may be mounted on a controlled X-Y table, each individual region 28 being subjected to spectrophotometric analysis. Alternately, if a greater signal is desired, a plurality of regions 28 may be provided with a first exposed analyzing functionality, adjacent to other pluralities of regions 28 having different exposed analyzing functionalities.

According to another embodiment in which a biosensor is provided, regions 28 may be provided with a functionality defining a binding partner of a particular analyte. In an analogy of a competitive assay, a known quantity of labeled analyte may be provided in a medium along with an unknown quantity of analyte, and the medium exposed to regions 28. Alternately, in an assay analogous to a sandwich assay, a medium containing an unknown quantity of analyte and an excess of a second binding partner that would bind to the analyte when it binds to functionalities on regions 28 may be provided. According to either method, after regions 28 are exposed to the test medium, analysis may be carried out according to a variety of methods. According to one method, the analyte of known quantity (competitive assay) or binding partner in excess (sandwich assay) may be tagged with a reflective species such as gold. Then, a laser or the like may be directed at regions 28, and analysis made on the basis of reflectants. Alternately, a large region of regions 28 may be illuminated with coherent electromagnetic radiation, and a diffraction pattern observed, the intensity of the diffraction pattern being used to quantitate the amount of immobilized label. The label may take the form of any known test assay label, for example a radioactive label, chemiluminescence label, fluorescent label, or the like. Additionally, a bioassay may be provided according to the present invention by providing a SAM pattern on a surface, portions of the surface remaining free of SAM. Then, the exposed portions may be contacted with a species selected to react chemically with the material, and the material may be contacted with the species for a predetermined period of time to etch physical wells in the material surface of a predetermined depth. Then, the SAM may be removed, revealing the welled surface. According to the invention, and with reference to FIGS. 1b and c, a plurality of wells in a surface having very small dimension and spaced in very close proximity may be created. This may serve as a very high-density assay plate, for example, an ELISA assay plate.

As described above, it is not always necessary or advantageous to complete the coat surface 30 with a continuous SAM. According to one embodiment, material surface 30 may be coated with an SAM of molecular species 28 according to a particular pattern, the pattern providing for portions of surface 38 adjacent the SAM that remain free of SAM-forming molecular species and remain exposed, the exposed portions being subjected to further etching or plating. When a conductive material 32 is employed, any electrochemical plating may be employed. Additionally, electroless plating may be effected, and this is particularly advantageous when material 32 is nonelectrically conductive. Electroless plating is a well-known art, and is described in U.S. Pat. No. 5,079,600, referenced above, as well as the article entitled "Plating of Plastics—Recent Developments" by F. A. Domino, Chemical Technology Review, No. 138, Noyes, Data Corporation, New Jersey (1979). Such plating may result in formation of a microelectronic device or the like. When an etching step is used to etch away portions of material 32 not coated with a SAM, the molecular species used for formation of the SAM and the etchant should be selected such that the etchant does not destroy the SAM.

Exemplary etchants include thiosulfate, thiocyanate, or cyanide in base with oxygen or ferricyanide as oxidant.

The present invention has a variety of uses and functions, many of which will become apparent to the reader upon reading the examples below. For example, since small electrically conductive materials can be plated onto a surface according to a well-defined, predetermined pattern inexpensively and reproducibly, the present invention is well-suited to the fabrication of microelectronic resistors, transistors, capacitors, circuit breakers, and other electronic devices and circuits.

In the fabrication of microcircuitry, it is particularly advantageous to save space by stacking interconnected chips or circuits, rather than placing such chips or circuits in a coplanar, continuous configuration. However, to do so requires provision of electrical connection between various portions of the respective chips or circuits, adding to the failure rate of such systems. Accordingly, a particular advantage of the invention is provision of the ability to print electrically conductive materials around curves, corners, and in general on any nonplanar surface. The flexibility of the stamp of the present invention provides for such printing. According to the invention, a two-stage circuit having an interconnecting portion may be advantageously fabricated by providing a mold including the two circuit portions and interconnecting conductive pathways, forming a stamp from the mold, and using the stamp to create a SAM on a nonplanar surface to create the two-stage circuit according to the above-described etching and/or plating methods. The inventive stamp may be conformed to the nonplanar surface to do so, and it may be particularly advantageous to form the system such that the most stress placed on the stamp during the printing step occurs in the interconnecting regions, that is, that the interconnecting portion imprints of the stamp are bent to conform to the surface. This is because these portions may be substantially linear, and conforming them to a curved surface may have minimal effect on their reproduction.

Alternately, a mold of a nonplanar circuit may be created, and the stamp formed from the mold. In this way the stamp may be utilized to pattern a SAM on a similar nonplanar surface without subjecting the stamp to stress. According to this method the stamp need not be as formable as is needed for the method in which the stamp is formed in a planar fashion, and is then conformed to a nonplanar surface.

The present invention also finds use in the production of ornamental items such as jewelry and other items exploiting the refraction of light.

Figure 8:
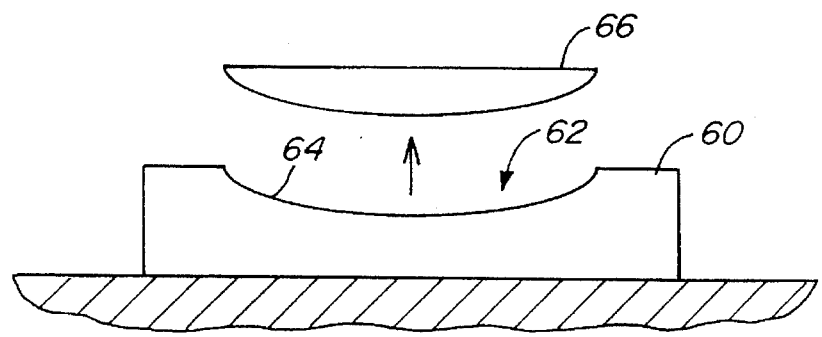
FIG. 8 illustrates schematically the formation of a convex-plano lens in accordance with one embodiment of the present invention.
Figure 9:
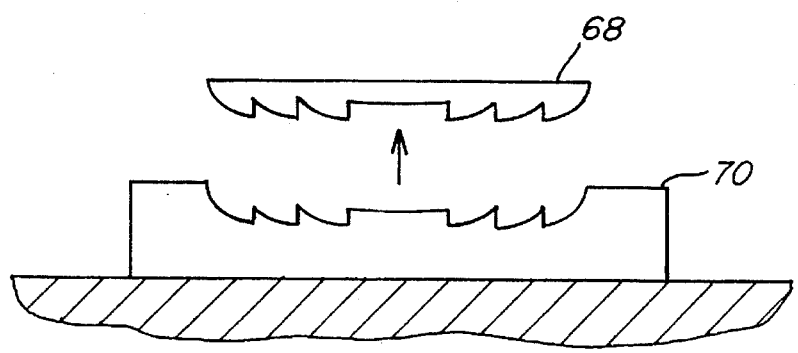
FIG. 9 illustrates schematically the formation of a fresnel lens in accordance with one embodiment of the present invention.

Additionally, the present invention may be advantageously used to produce optical elements such as lenses and diffraction gratings. FIGS. 8 and 9 illustrate the formation of lenses out of the material used to fabricate stamp 20 of the invention, or other material that need not necessarily have the swelling or elastic properties of stamp 20. The latter will generally be the case when the resultant lens need not be conformed to a shape other than its own. In FIG. 8, a mold 60 is provided for forming a convex plano lens. The lens-forming material, polydimethylsiloxane according to a preferred embodiment, in a soft state, is pressed or poured into portion 62 of mold 60. A release material may be applied to surface 64 to allow easy removal of the finished lens. When the lens-forming material has hardened, it may be removed from mold 60 and forms lens 66. In the same manner, the lens-forming material may be formed into a fresnel lens. A fresnel lens is a thin equivalent of a thick lens that is achieved by segmenting a spherical surface and moving each concentric segment toward the plano surface. FIG. 9 illustrates a fresnel lens 68 formed using mold 70. Mold 70 may be micromachined, for example by cutting a bronze alloy on a lathe using a diamond saw. The mold 70 is then used to form fresnel lens 68 in the manner described in connection with the formation of convex-plano lens 66 in FIG. 8.

Figure 7A:
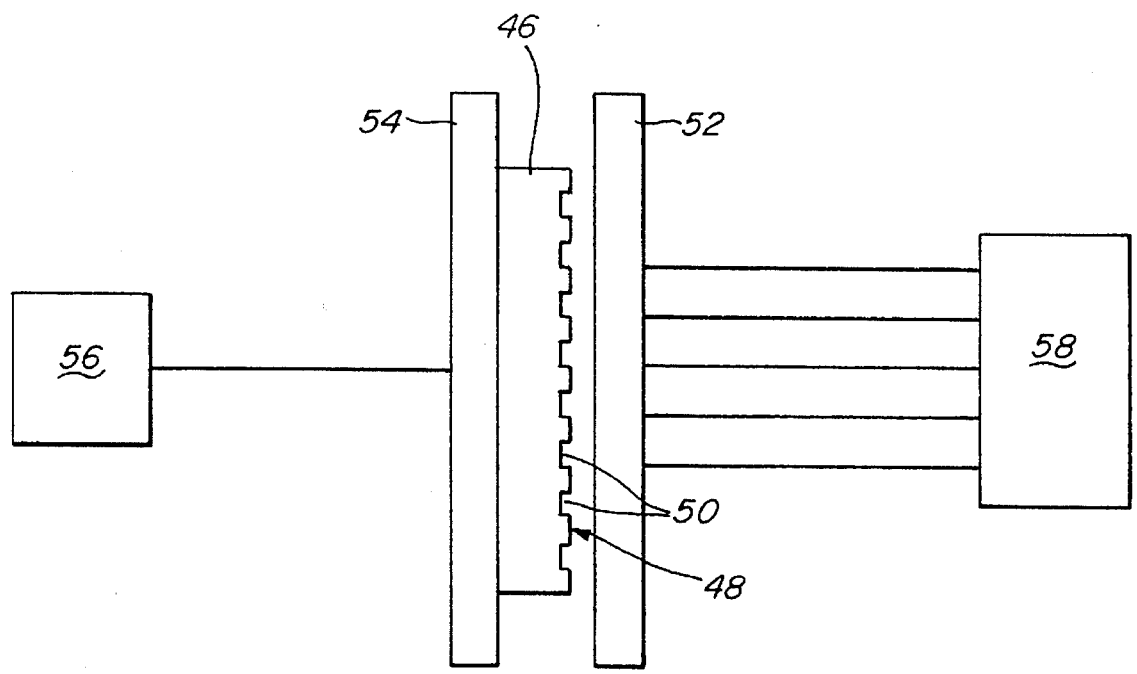
FIGS. 7a–7b are schematic illustrations of an optical switch prepared according to the present invention.
Figure 7B:
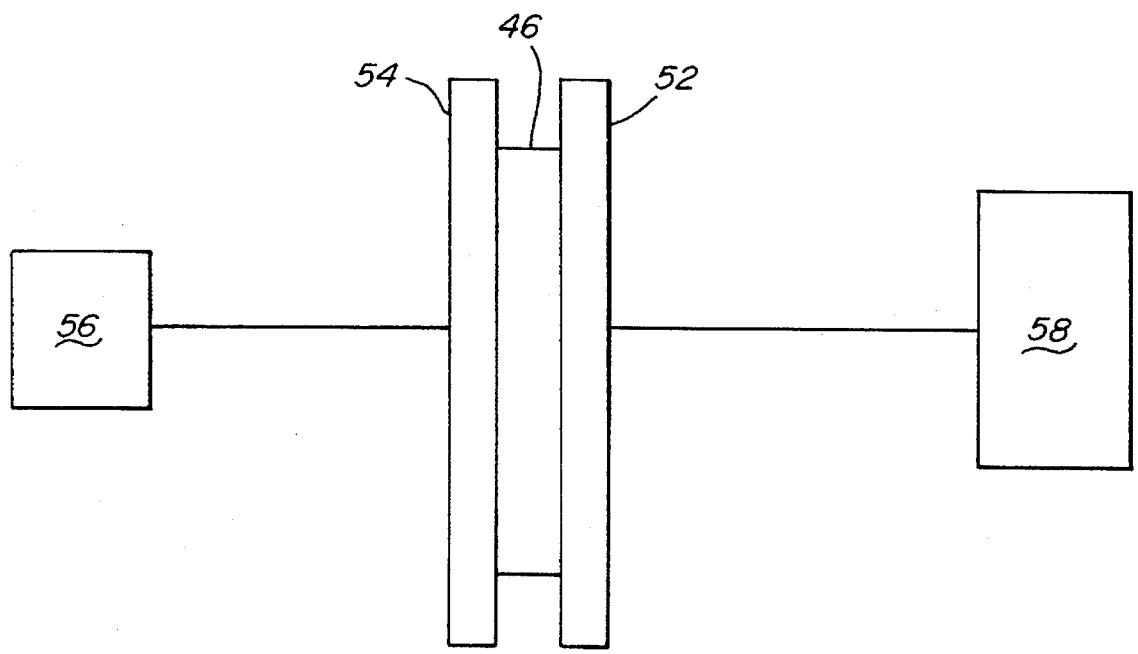

Additionally, an optical switch may be formed according to the present invention. Referring to FIG. 7a, an elastic switching member 46 formed from a hardenable fluid is illustrated and includes surface 48 of the member having a plurality of indentations 50 formed therein. A modulator is placed so as to contact the switching member and to place the switching surface into a first, unstressed conformation in which switching member 46 diffracts light and or into a second, stressed conformation in which switching member 46 passes light undiffracted. As illustrated, a modulator in the form of a glass slide 52 is placed so as to contact the switching member 46. Another glass slide 54 may be placed on another side of the switching member. A source of electromagnetic radiation 56 is then positioned so as to irradiate the switching member through the switching surface. A detector 58 may be positioned to detect electromagnetic radiation passing through the switching member. According to the exemplary embodiment, a visual image is observed. Finger pressure may be used to exert a force on glass slide 52 in the direction of glass slide 54 as seen in FIG. 7(b). As a result, switching surface 48 is transformed from the first, unstressed conformation to the second, stressed conformation. As a result, light that had been refracted by switching surface 48 was blurred.

Figure 10:
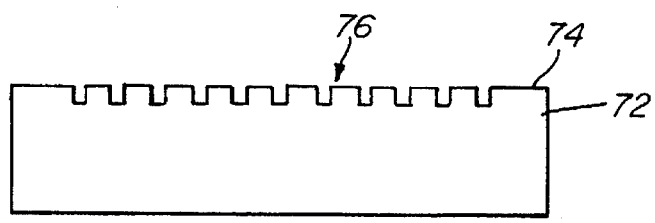
FIG. 10 is a diffraction grating fabricated in accordance with one embodiment of the invention.

Diffraction gratings may also be formed from the lens-forming material. As shown in FIG. 10, a block of lens-forming material 72 is provided. A surface 74 of the material is micromachined to produce a pattern 76 on surface 74. This diffraction grating may be used as an optical element itself or as a stamp to create diffraction gratings on other materials in accordance with the stamping method of the invention.

The function and advantage of these and other embodiments of the present invention will be more fully understood from the examples below. The following examples are intended to illustrate the benefits of the present invention, but do not exemplify the full scope of the invention.

EXAMPLE 1

A mold according to the present invention was fabricated. A template consisting of an exposed and developed photoresist pattern on silicon is prepared (This type of fabrication is described in any conventional photolithography text, such as *Introduction to Microelectronic Fabrication,* by Richard C. Jaeger, Gerold W. Neudeck and Robert F. Pierret, eds., Addison-Wesley, 1989). Templates such as electron microscopy grids or other corrugated materials may also be used. The template is placed in a container such as a petri dish. A 10:1 (w:w or v:v) mixture of PDMS-Sylgard Silicone Elastomer 184 and Sylgard Curing Agent 184 (Dow Corning Corp., Midland, Mich.) was poured into the petri dish. It was not necessary to put the mixture of PDMS-elastomer and curing agent under vacuum to remove dissolved dioxygen. The PDMS cured at room temperature in the laboratory ambient for 30 to 60 min. This cure was followed by additional curing at 65° C. for approximately one hour or until the polymer was rigid. After cooling to room temperature, the PDMS-stamp was carefully peeled from the template.

EXAMPLE 2

Figure 2B:
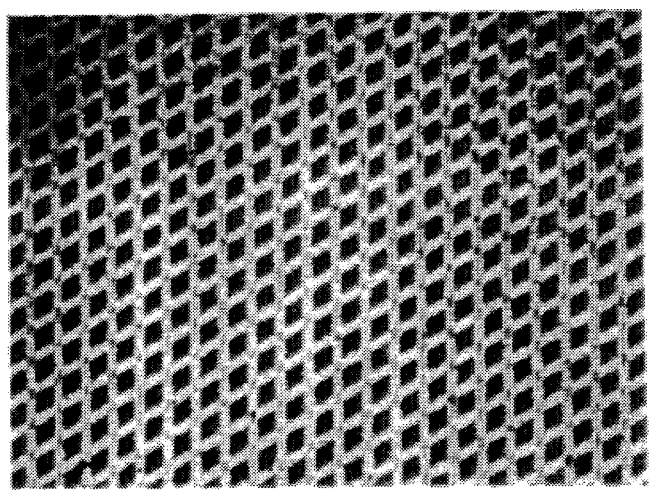
Figure 2C:
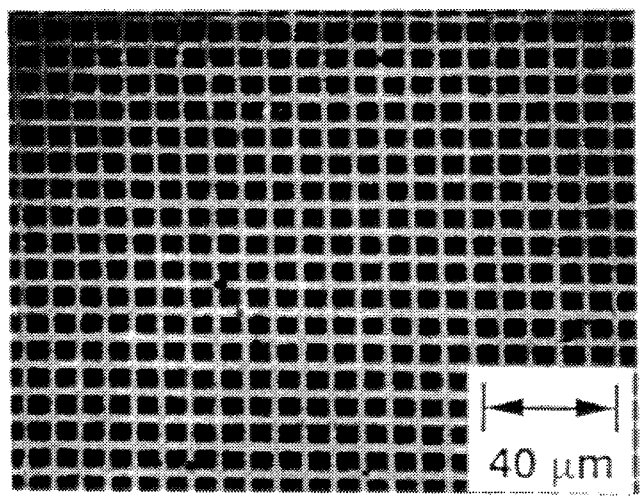

A stamp fabricated in accordance with Example 1 was fabricated. The stamp was fabricated so as to have a linear indentation pattern contiguous with a liner stamping surface pattern. That is, the stamp had an array of indentational lines separating stamping surface lines. The surface was coated with hexadecanethiol in ethanol using a cotton swab. The stamp was applied to a smooth gold surface, and removed. The resultant pattern is illustrated in FIG. 2(a). Parallel SAM lines of 2 microns in width are illustrated. In FIG. 2(b), after removal of the stamp, the stamping surface was recoated and rotated approximately 45° to a second orientation, and reapplied to the surface. In FIG. 2(c), the procedure described with respect to FIG. 2(b) was carried out, with rotation of the stamp 90° from the first orientation to the second orientation prior to the second stamping. A grid pattern results.

EXAMPLE 3

Figure 3A:
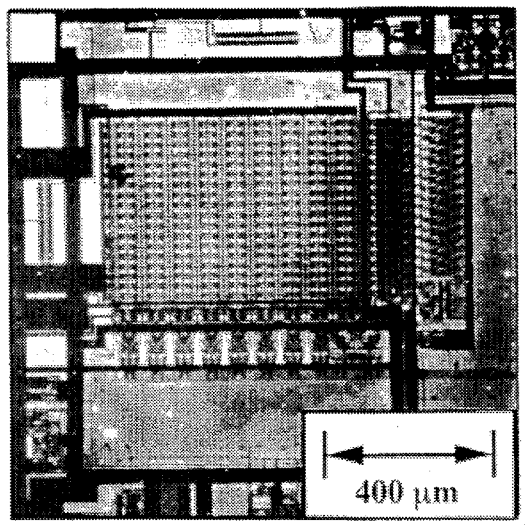
FIGS. 3a–3f provide photocopies of SEM images of several types of structures, formed according to the stamping method of the present invention followed by chemical etching.
Figure 3B:
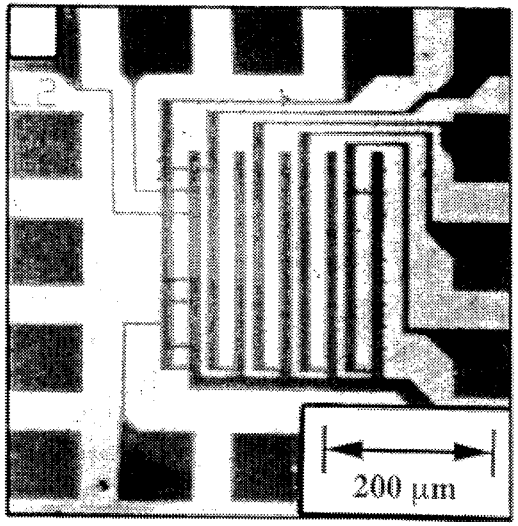
Figure 3C:
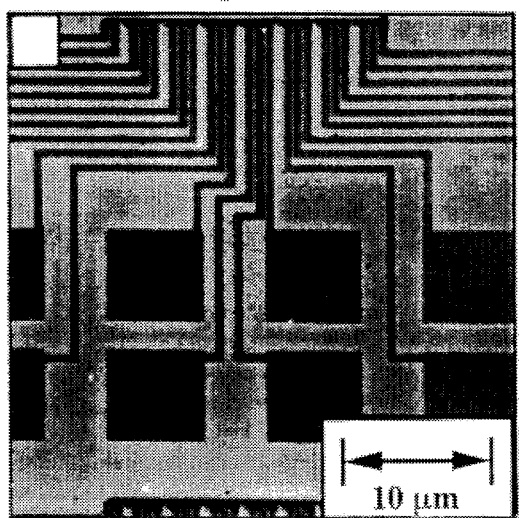
Figure 3D:
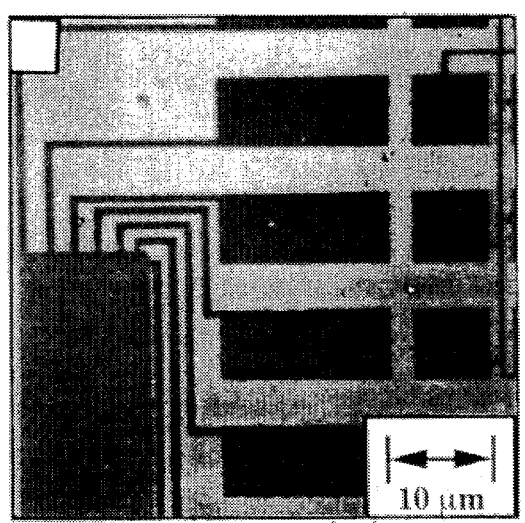
Figure 3E:
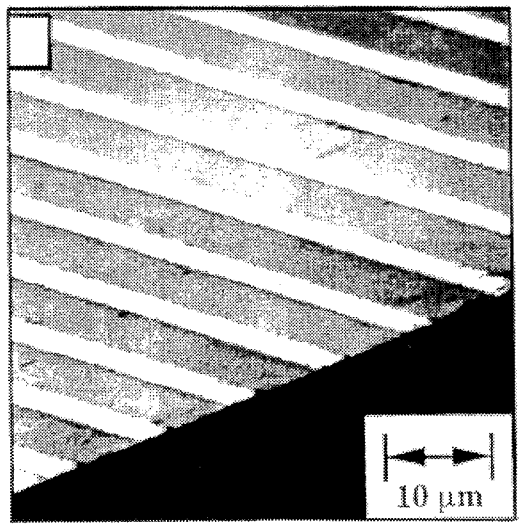
Figure 3F:
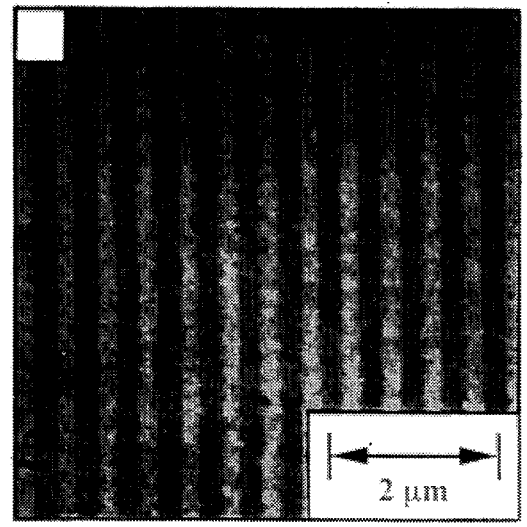
Figure 4A:
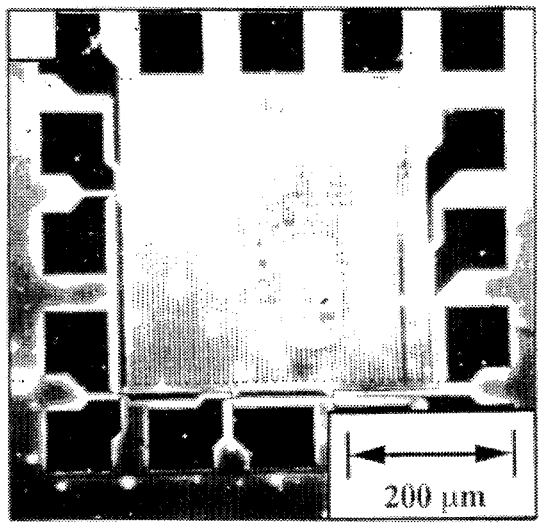
FIGS. 4a–4f provide photocopies of SEM images of a variety of surfaces patterned by effecting the stamping method of the present invention followed by electroless plating.
Figure 4B:
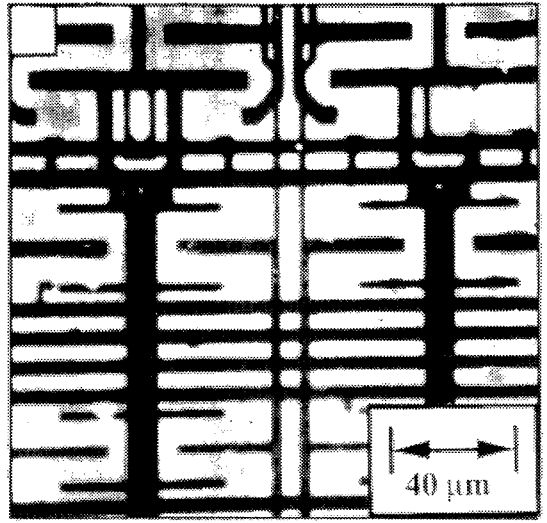
Figure 4C:
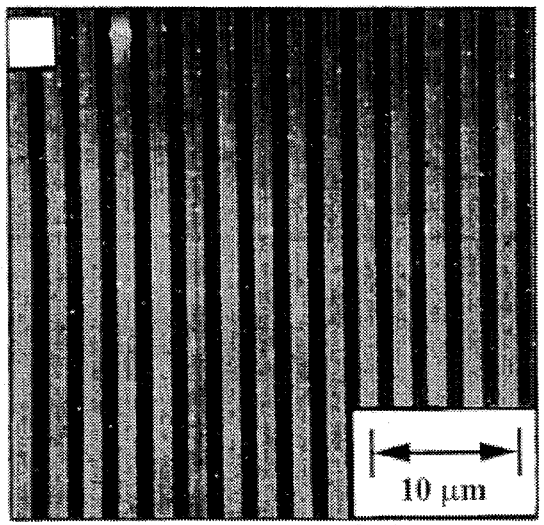
Figure 4D:
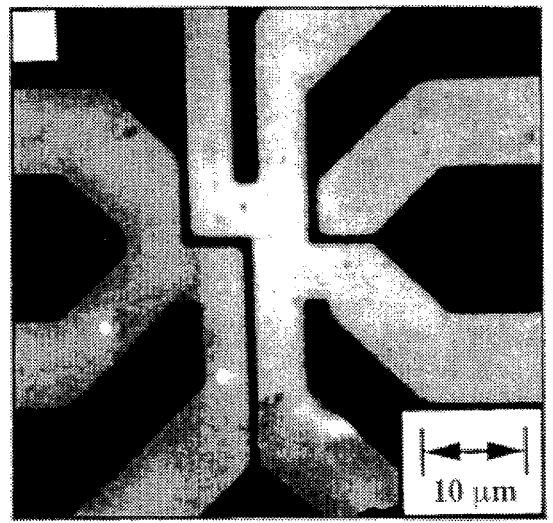
Figure 4E:
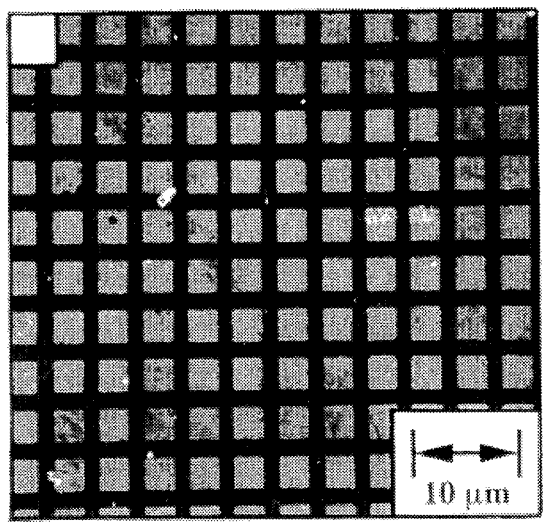
Figure 4F:
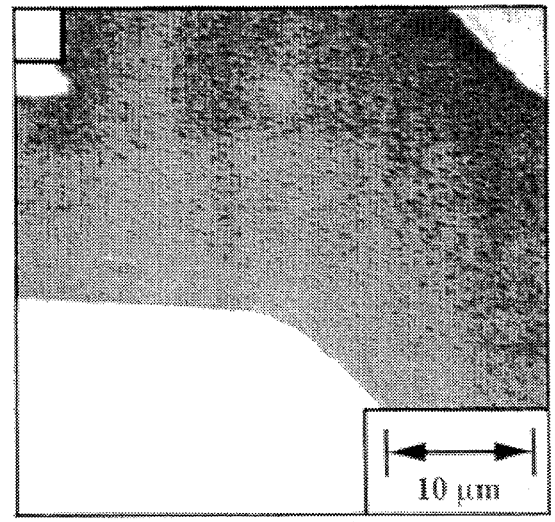

When clean gold is exposed to an aqueous solution of cyanide ion in the presence of a mild oxidant, such as dioxygen or ferricyanide, the gold dissolves. A SAM comprising hexadecanethiolate protects the gold from dissolving in this environment. A plurality of stamps were formed using a plurality of microelectronic devices and arrays as forms. The stamping surfaces were coated with hexadecanethiolate in ethanol, transferred to gold surfaces, and the stamping surfaces removed to produce SAM arrays. The remaining gold surface was etched and the hexadecanethiolate SAM removed. The results are illustrated in FIG. 3, where the etched substrate appears dark, and the remaining gold arrays appear light. In FIG. 3(f), an array of gold lines having a lateral dimension of about 0.2 microns is shown.

EXAMPLE 4

A plurality of stamps were fabricated using molds from microelectrode arrays, and according to other patterns. Using each stamp, a SAM of hexadecanethiolate was prepared on a gold surface, followed by electroless plating in a Niposit plating bath, Shipley Corporation, Marlborough, Mass. The results are shown in FIG. 4. The light-colored nickel features appear on the gold background. Nickel structures having lateral dimensions of less than 1 micron are observed.

EXAMPLE 5

Figure 5:
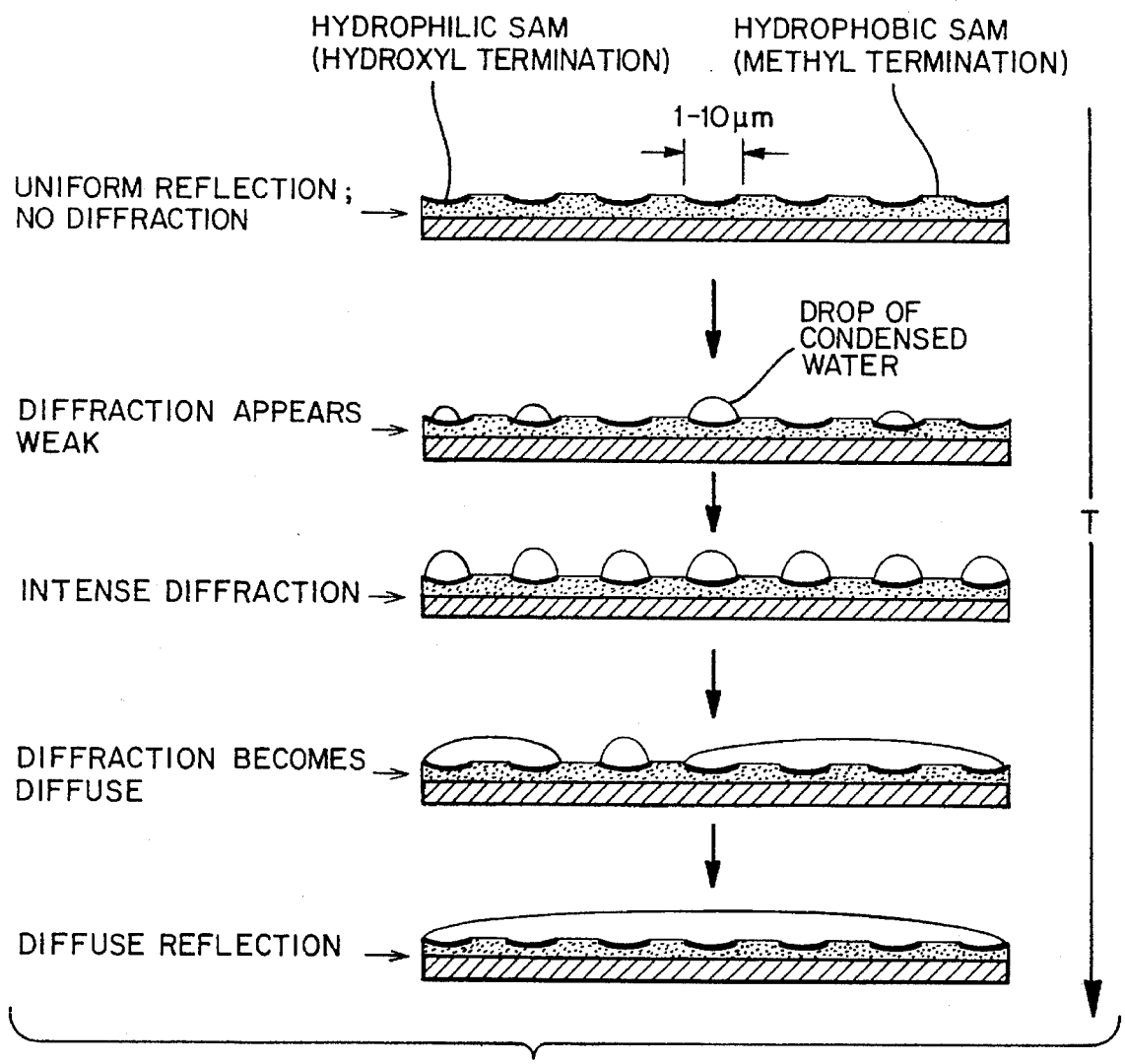
FIG. 5 is a schematic representation of the formation of condensation figures on a SAM-coated material surface according to the present invention.

Condensation figures are arrays of liquid drops that form upon condensation of vapor onto a solid surface. The examination of condensation figures has historically been used as a method to characterize the degree of contamination on an otherwise homogeneous surface. An array of hydrophilic regions of SAM isolated by a continuous region of hydrophobic SAM (refer to FIG. 1(c)) produces a surface which condenses small droplets of water. Light reflected from such a surface produces diffraction patterns that depend upon the degree of condensation. Referring to FIG. 5, a schematic illustration of the formation of such droplets is illustrated. Condensation takes place as a function of time or temperature, or level of humidity. The observed reflection from the surface goes from no diffraction, to intense diffraction, to diffused reflection.

Figure 6A:
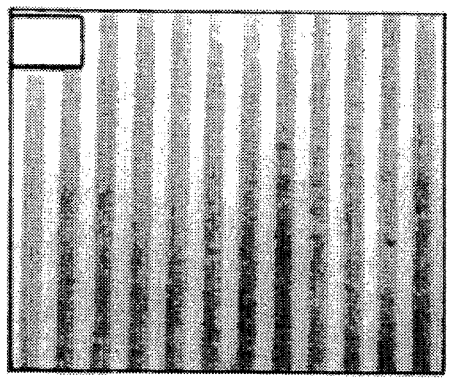
FIGS. 6a–6h provide photocopies of SEM images of a variety of surfaces patterned according to the present invention and diffraction patterns from condensation figures formed on the respective surfaces.
Figure 6B:
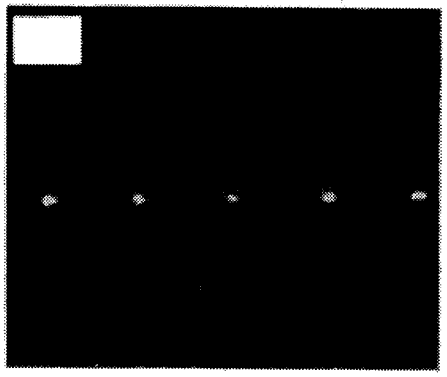
Figure 6C:
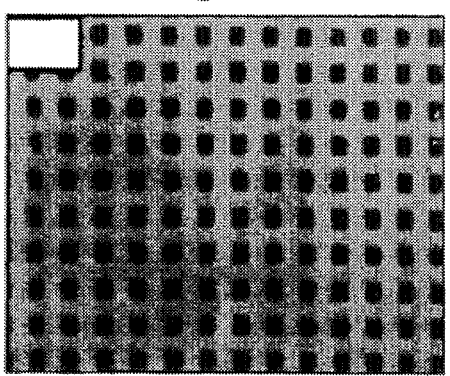
Figure 6D:
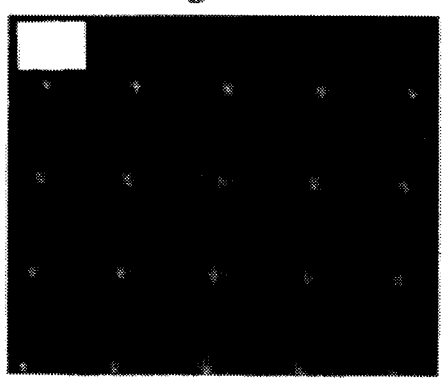
Figure 6E:
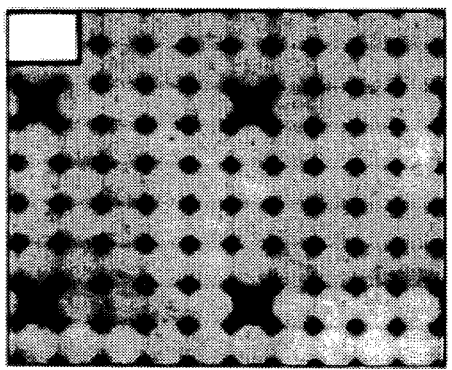
Figure 6F:
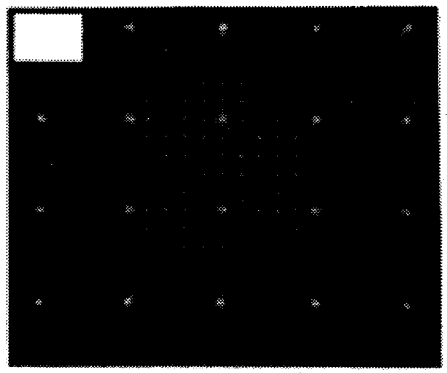
Figure 6G:
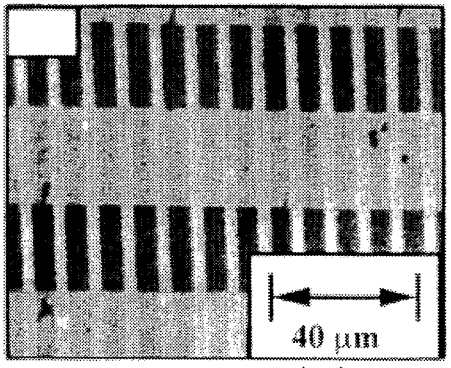
Figure 6H:
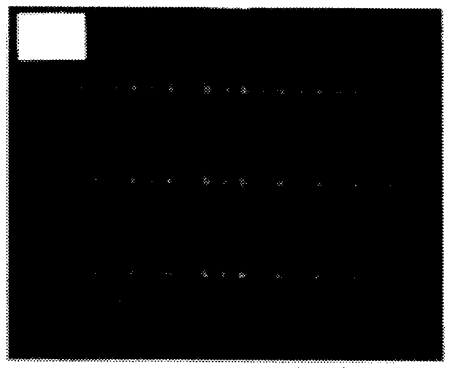

A variety of patterns were formed on gold using combinations of $HS(CH_2)_{15}CH_3$, $HS(CH_2)_{15}COOH$, and $HS(CH_2)_{11}H$. A stamp replicated from a photolithographically-patterned polymethylmethacrylate master was used to transfer thiols to the surface of gold. FIG. 6 illustrates a plurality of gold surfaces onto which the thiol was transferred according to a variety of patterns. FIG. 6(a) illustrates lines of hexadecanethiolate (light) in a field of SAM formed from $HS(CH_2)_{15}CO_2H$ (dark). Diffraction of a He:Ne laser beam (wavelength=632.8, 1mW) from a condensation figure formed on this surface produces a diffraction pattern at FIG. 6(b). FIG. 6(c) is a grid formed by stamping $HS(CH_2)_{15}CH_3$ (light) followed by exposure of the surface to $HS(CH_2)_{15}CO_2H$ (dark). The corresponding diffraction pattern is illustrated in FIG. 6(f). In FIG. 6(e) is shown a pattern having isolated SAM regions having different shapes. The corresponding diffraction pattern is shown in FIG. 6(f). In FIG. 6(g), three molecular species are used to create a SAM pattern having three types of regions. The dark regions are $HS(CH_2)_{15}CO_2H$. The lightest regions are $HS(CH_2)_{15}CH_3$. The gray areas are $HS(CH_2)_{11}OH$. The corresponding diffraction pattern is shown in FIG. 6(h).

EXAMPLE 6

An optical switch was fabricated by hardening a polydimethylsiloxane polymer from a mold fabricated by photolithography. The mold had a surface including protrusions of 1 micron depth and 2 micron width, spaced 3 microns from each other.

Referring to FIG. 7, an elastic switching member 46 comprising the results of the polydimethylsiloxane member resulted. Surface 48 of the member has a plurality of indentations formed therein. A modulator in the form of a glass slide 52 was placed so as to contact the switching member 46. Another glass slide 54 was placed on another side of the switching member. A source of electromagnetic radiation 56 was positioned so as to irradiate the switching member through the switching surface. A detector 58 may be positioned to detect electromagnetic radiation passing through the switching member. According to the exemplary embodiment, a visual image was observed. Finger pressure was used to exert a force on glass slide 52 in the direction of glass slide 54. As a result, switching surface 48 was transformed from a first, unstressed conformation to a second, stressed conformation. As a result, light that had been diffracted by switching surface 48 was transmitted without diffraction.

EXAMPLE 7

Described above is a method for condensation of water onto a patterned surface, the surface created by providing a SAM of isolated, hydrophilic regions surrounded by a SAM having hydrophobic functionality. In addition to condensation, aqueous solution, or water, may be provided on such a patterned array by slowly (less than 5 centimeters/second) withdrawing a patterned substrate from a solution that wets one or more SAMs. Additionally, by simply washing the surface with the appropriate solution, such structures will form. In this way, patterns of liquid may be produced, as microdrops, microtubules, etc., without the need for condensation. The shape and size of the microdrops, microtubules, and the like will be dictated by the shape and size of the isolated SAM regions of hydrophilicity. Such control is described above, and microreactors result.

Figure 11A:
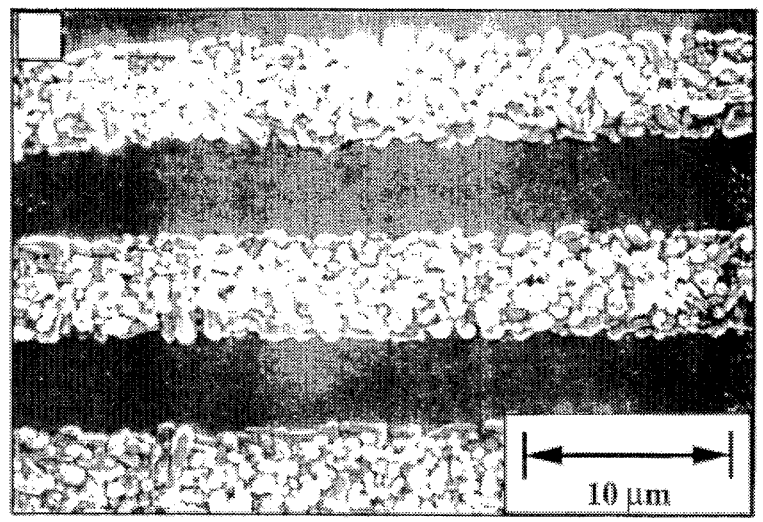
FIGS. 11a–e are photocopies of photomicrographs of crystals grown on hydrophilic regions of ordered arrays prepared in accordance with the present invention.
Figure 11B:
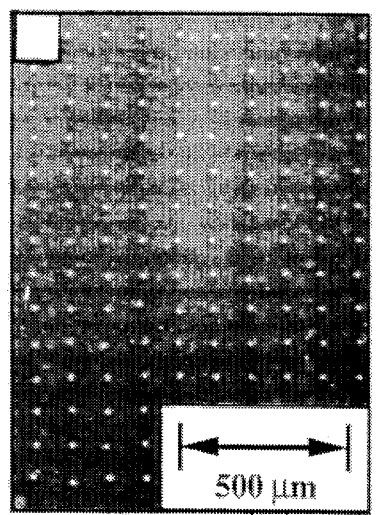
Figure 11C:
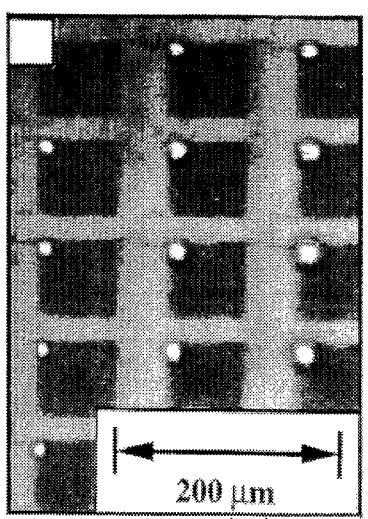
Figure 11D:
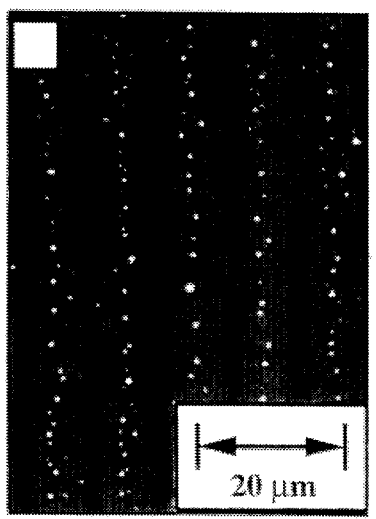
Figure 11E:
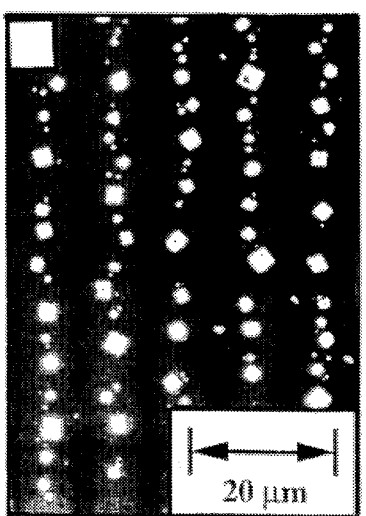
Figure 12A:
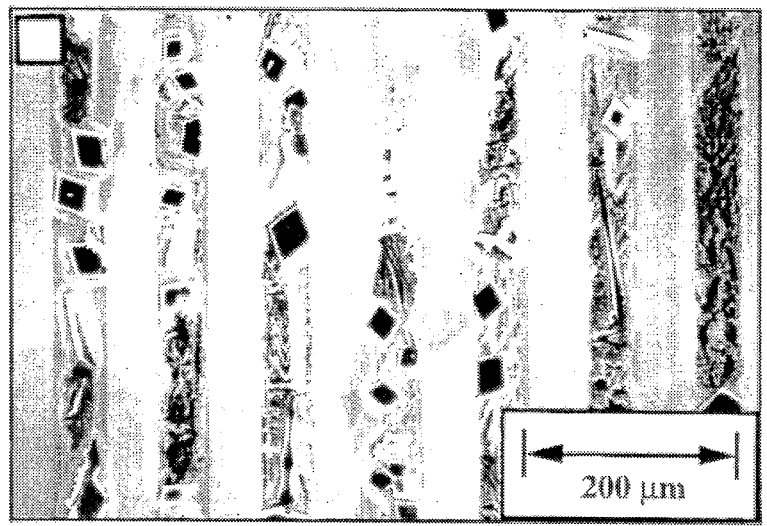
FIGS. 12a–c are photocopies of microphotographs of crystals grown on hydrophilic regions of ordered arrays prepared in accordance with the present invention.
Figure 12B:
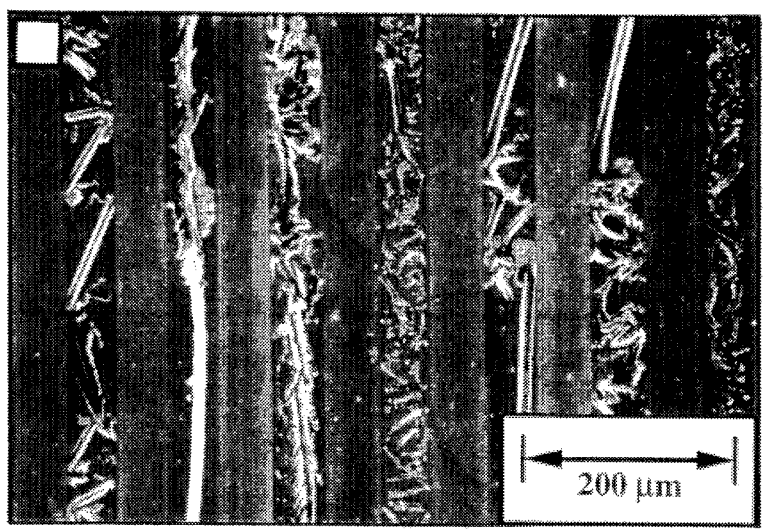
Figure 12C:
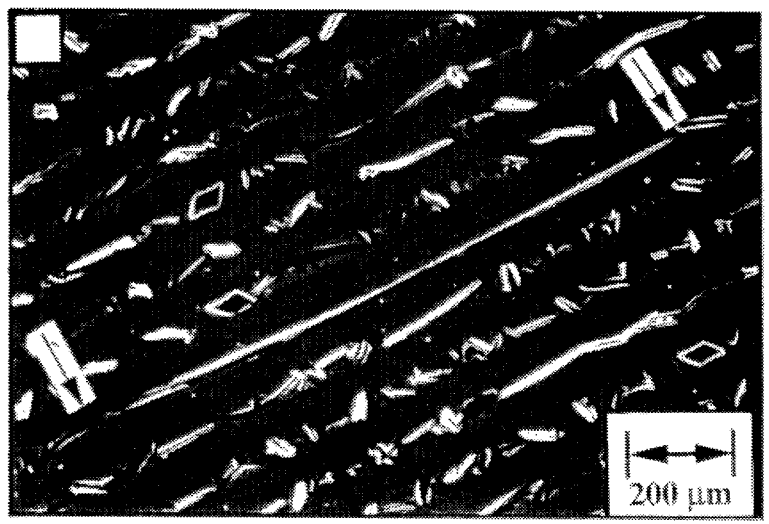

Patterns were formed as follows. Stamps were made of polydimethylsiloxane as SYLGARD 184 from Dow Corning. Gold films were deposited by electron beam evaporation on glass slides or silicon wafers that had been precoated with titanium (5 to 50 angstroms) to promote adhesion between silicon oxide and gold. Masters for fabrication of stamps were prepared using conventional photolithography. The stamp was used to coat gold with $HS(CH_2)_{15}CH_3$, and the stamping surface pattern of $HS(CH_2)_{15}CH_3$ was transferred to the gold surface to form hydrophobic regions. The gold was subsequently exposed to $HS(CH_2)_{15}COOH$ to create hydrophilic regions. The species coated on the stamping surface was delivered in ethanol at 1–10 mM. Referring now to FIG. 11, a plurality of crystal formations on the hydrophilic regions is illustrated. FIG. 11a illustrates $LiClO_4$, crystallized from a saturated solution of methanol that formed on the hydrophilic SAM regions of a pattern substrate. FIGS. 11b and c show arrays of crystals of $CuSO_4$ that formed on hydrophilic regions from 1M, aqueous solutions. Referring to FIG. 11d, crystals that formed from patterned solutions of KI are shown. The solution used to prepare the crystalization was 0.1M. In FIG. 11e is shown crystals formed from a pattern solution of 3M KI. The crystallization shown in FIGS. 11d and e were carried out by evaporating the water in an oven at 95° C. Referring now to FIG. 12, a demonstration of the control of morphology and shape of the formation of crystals is shown. Microtubules of water containing 1M $K_3Fe(CN)_6$ were formed on the hydrophilic regions. In FIG. 12(a), crystals resulting from evaporation of liquid in an oven at 95° C. is shown. In FIG. 12(b), crystals resulting from evaporation of liquid in the air at 22° C. (relative humidity 60%) is shown. In FIG. 12(c), an expanded view of an array of crystals grown in the manner described with respect to FIG. 12(b) is shown, particularly showing a highly ordered and linear crystal in the central portion of the figure.

Those skilled in the art would readily appreciate that all parameters listed herein are meant to be exemplary and actual parameters will depend upon the specific application for which the methods and apparatus of the present invention are being used. It is, therefore, to be understood that the foregoing embodiments are presented by way of example only and that, within the scope of the appended claims and equivalents thereto, the invention may be practiced otherwise than as specifically described.

What is claimed is:

1. A method of patterning a material surface, comprising the steps of:
   (a) providing a stamp having a surface including at least one indentation formed therein, said indentation contiguous with a stamping surface defining a first pattern;
   (b) coating said stamping surface with a molecular species terminating at a first end in a functional group selected to bind to said material;
   (c) positioning said stamping surface in a first orientation and contacting a portion of said material surface with said stamping surface to hold said molecular species against said material surface portion to allow said functional group to bind thereto; and
   (d) removing said stamping surface to provide a self-assembled monolayer of said molecular species on said material surface according to said first pattern in said first orientation.

2. The method as recited in claim 1, at least one second portion of said material surface, contiguous with said material surface portion onto which said self-assembled monolayer is provided, remaining free of said molecular species.

3. The method as recited in claim 2, step (b) further comprising:
   allowing said molecular species to swell into said stamping surface.

4. The method as recited in claim 2, and further comprising the steps of:
   (e) positioning said stamping surface in a second orientation different from said first orientation, and contacting a portion of said material surface with said stamping surface to hold said molecular species against said material surface to allow said functional group to bind thereto; and
   (f) removing said stamping surface to provide a self-assembled monolayer of said molecular species on said material surface according to said first pattern in said second orientation.

5. The method as recited in claim 4, said self-assembled monolayer of said molecular species on said material surface in said second orientation intersecting portions of said self-assembled monolayer in said first orientation and forming a continuous self-assembled monolayer therewith.

6. The method as recited in claim 5, at least one second portion of said material surface, contiguous with said continuous self-assembled monolayer, remaining free of said molecular species.

7. The method as recited in claim 6, and further comprising the steps of:
   (e) contacting said at least one second material surface portion with a second molecular species terminating at a first end in a functional group selected to bind to said material to form a self-assembled monolayer of said second molecular species continuous with said molecular species self-assembled monolayer on a surface of said material.

8. The method as recited in claim 7, said self-assembled monolayer of said molecular species on said material surface according to said first pattern in said second orientation being free of intersection with said self-assembled monolayer according to first pattern in said first orientation.

9. The method as recited in claim 2, and further comprising the steps of:
   (e) coating said stamping surface with a second molecular species different from said first species, said second species terminating at a first end in a functional group selected to bind to said material;
   (f) positioning said stamping surface in a second orientation different from said first orientation, and contacting a portion of said material surface with said stamping surface to hold said second molecular species against said material surface to allow said functional group to bind thereto; and
   (g) removing said stamping surface to provide a self-assembled monolayer of said second molecular species on said material surface according to said first pattern in said second orientation.

10. The method as recited in claim 9, said self-assembled monolayer of said second molecular species being free of intersection with said self-assembled monolayer of said molecular species.

11. The method as recited in claim 2, and further comprising the steps of:
   (e) providing a second stamp having a surface including at least one indentation formed therein, said indentation contiguous with a second stamping surface defining a second pattern different from said first pattern;
   (f) coating said second stamping surface with a second molecular species different from said first species, said second species terminating at a first end in a functional group selected to bind to said material;
   (g) contacting a portion on said material surface with said second stamping surface to hold said second molecular species against said material surface to allow said functional group to bind thereto; and (h) removing said second stamping surface to provide a self-assembled monolayer of said second molecular species on said material surface according to said second pattern.

12. The method as recited in claim 11, said self-assembled monolayer of said second molecular species being free of intersection with said self-assembled monolayer of said molecular species.

13. The method as recited in claim 2, and further comprising the steps of:

(e) providing a second stamp having a surface including at least one indentation formed therein, said indentation contiguous with a second stamping surface defining a second pattern different from said first pattern;

(f) coating said second stamping surface with said molecular species;

(g) contacting a portion of said material surface with said second stamping surface to hold said molecular species against said material surface to allow said functional group to bind thereto; and (h) removing said second stamping surface to provide a self-assembled monolayer of said molecular species on said material surface according to said second pattern.

14. The method as recited in claim 13, said self-assembled monolayer of said molecular species on said material surface according to said first pattern intersecting portions of said self-assembled monolayer according to second pattern and forming a continuous self-assembled monolayer therewith.

15. The method as recited in claim 13, said self-assembled monolayer of said molecular species on said material surface according to said first pattern being free of intersection with said self-assembled monolayer according to second pattern.

16. The method as recited in claim 2, and further comprising the steps of:

(e) contacting said at least one second material surface portion with a reactant selected to react chemically therewith and selected to be chemically inert with respect to said molecular species such that said at least one second material surface portion is degraded; and (f) removing said molecular species to uncover said at least one material surface portion.

17. The method as recited in claim 2, and further comprising the steps of:

(e) plating said at least one second material surface portion with a plating reagent; and (f) removing said molecular species to uncover said material surface portion remaining free of plating.

18. The method as recited in claim 2, and further comprising the steps of:

(e) contacting at least one portion of said at least one second material surface portion with a second molecular species terminating at a first end in a functional group selected to bind to said material.

19. The method as recited in claim 2, and further comprising the steps of:

(e) contacting said at least one second material surface portion with a second molecular species terminating at a first end in a functional group selected to bind to said material to form a self-assembled monolayer of said second molecular species contiguous with said molecular species self-assembled monolayer on a surface of said material.

20. The method as recited in claim 19, said molecular species terminating at a second end thereof in a first functionality and said second molecular species terminating at a second end thereof in a second functionality, said self-assembled monolayer comprising at least one exposed portion exhibiting said first functionality according to a first pattern contiguous with at least one second exposed portion exhibiting said second functionality according to a second pattern.

21. The method as recited in claim 16, said material surface including at least one nonplanar portion.

22. The method as recited in claim 21, said at least one nonplanar portion being defined by at least two circuit regions interconnected by a connecting portion.

23. The method as recited in claim 20, said molecular species terminating at a second end thereof in a hydrophobic functionality and said second molecular species terminating at a second end thereof in a hydrophilic functionality.

24. The method as recited in claim 20, said second pattern comprising at least one discrete region exposing said second functionality and said first pattern comprising a continuous region exposing said first functionality isolating said at least one discrete region exposing said second functionality.

25. The method as recited in claim 24, said second pattern comprising a plurality of discrete regions exposing optical recording material and said first pattern comprising a continuous region of optically inert material isolating said plurality of optical recording material regions.

26. The method as recited in claim 24, said second pattern comprising at least one discrete region of hydrophobicity and said second pattern comprising a continuous region of hydrophilicity isolating said at least one region of hydrophobicity.

27. The method as recited in claim 20, said molecular species terminating at a second end thereof in a hydrophobic functionality and said second molecular species terminating at a second end thereof in a hydrophilic functionality.

28. The method as recited in claim 27, said first pattern comprising at least one discrete region of hydrophobicity and said second pattern comprising a continuous region of hydrophilicity isolating said at least one region of hydrophilicity.

29. The method as recited in claim 1, step (a) comprising the steps of:

(e) fabricating a mold surface including at least one protrusion;

(f) contacting said mold surface with a hardenable fluid;

(g) hardening said fluid to form a stamp including a surface contacting said mold surface; and (h) removing said stamp from said mold surface.

30. The method as recited in claim 29, step (e) comprising:

(e) micromachining said mold surface.

31. A method of etching an electrically conductive material provided on a substrate, comprising the steps of:

(a) providing a stamp having a surface including a plurality of indentations formed therein defining an indentation pattern, said indentations contiguous with a stamping surface defining a stamping pattern;

(b) coating said stamping surface with a molecular species terminating at a first end in a functional group selected to bind to said conductive material;

(c) contacting first portions of a surface of said conductive material with said stamping surface to hold said molecular species against said conductive material surface portions to allow said functional group to bind thereto;

(d) removing said stamping surface to provide a self-assembled monolayer of said molecular species on said first conductive material surface portions according to said stamping pattern, second portions of said conductive material surface remaining free of said molecular species according to said indentation pattern;

(e) contacting said second conductive material surface portions with a reactant selected to react chemically therewith and selected to be chemically inert with respect to said molecular species, such that said second portions of said conductive material are degraded;

(f) removing said degraded portions of said conductive material; and (g) removing said molecular species to uncover said first portions of said conductive material formed according to said stamping pattern.

32. The method as recited in claim 31, said conductive material surface being nonplanar, and step (c) comprising:

conforming said stamp to said nonplanar conductive surface so as to contact first portions of said conductive surface with said stamping surface to hold said molecular species against said first conductive material surface portions to allow said functional group to bind thereto.

33. A method of etching an electrically conductive material provided on a substrate, comprising the steps of:

(a) using a stamp formed from a micromachined mold to transfer a molecular species to an electrically conductive material provided on a substrate, said molecular species forming a self-assembled layer, said self-assembled layer being contiguous with exposed portions of said electrically conductive material;

(b) contacting said exposed conductive material portions with a reactant selected to react chemically therewith and selected to be chemically inert with respect to said molecular species, such that said exposed portions are degraded;

(c) removing said degraded portions; and (d) removing said molecular species.

34. The method as recited in claim 33, said substrate being nonplanar, and step (c) comprising:

(c) conforming said stamp to said nonplanar substrate surface so as to contact first portions of said substrate surface with said stamping surface to hold said molecular species against said first substrate surface portions to allow said functional group to bind thereto.

35. A method of plating a predetermined pattern of material on a substrate, comprising the steps of:

(a) using a stamp formed from a micromachined mold to transfer a molecular species to a substrate, said molecular species forming a self-assembled layer, said self-assembled layer being contiguous with exposed portions of said substrate;

(b) plating said exposed substrate portions with a plating reagent; and (c) removing said molecular species.

36. A method of plating a predetermined pattern of material on a substrate, comprising the steps of:

(a) providing a stamp having a surface including a plurality of indentations formed therein defining an indentation pattern, said indentations contiguous with a stamping surface defining a stamping pattern;

(b) coating said stamping surface with a molecular species terminating at a first end in a functional group selected to bind to said substrate;

(c) contacting first portions of a surface of said substrate with said stamping surface to hold said molecular species against said first substrate surface portions to allow said functional group to bind thereto;

(d) removing said stamping surface to provide a self-assembled monolayer of said molecular species on said first substrate surface portions according to said stamping pattern, second portions of said substrate surface contiguous with said first portions remaining free of said molecular species according to said indentation pattern;

(e) plating said second substrate surface portions with a plating reagent; and (f) removing said molecular species to uncover said first portions of said substrate surface according to said stamping pattern bordered by plated portions of said substrate surface according to said indentation pattern.

37. The method as recited in claim 1, and further comprising the steps of:

(e) coating said at least one second material surface with a conductive polymer precursor;

(f) polymerizing said conductive polymer precursor; and (g) removing said molecular species to uncover said conductive polymer.

38. A method for derivatizing a surface, comprising the steps of:

applying instantaneously to a surface a plurality of discrete isolated regions of a first, self-assembled layer forming molecular species while leaving intervening regions free of said species.

39. A method of patterning a material surface, comprising the steps of:

(a) providing a stamp having a surface including at least one indentation formed therein, said indentation contiguous with a stamping surface defining a first pattern, said stamping surface having at least one feature having a lateral dimension of less than 100 microns;

(b) coating said stamping surface with a molecular species selected to bind to said material;

(c) positioning said stamping surface in a first orientation and contacting a portion of said material surface with said stamping surface to hold said molecular species against said material surface portion to allow said species to bind thereto; and (d) removing said stamping surface to provide said molecular species on said material surface according to said first pattern in said first orientation.

* * * * *